United States Patent
Yamanaka

(10) Patent No.: US 11,864,434 B2
(45) Date of Patent: Jan. 2, 2024

(54) DISPLAY DEVICE

(71) Applicant: Sharp Kabushiki Kaisha, Sakai (JP)

(72) Inventor: Shigetsugu Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/920,426

(22) PCT Filed: May 25, 2020

(86) PCT No.: PCT/JP2020/020466
§ 371 (c)(1),
(2) Date: Mar. 7, 2023

(87) PCT Pub. No.: WO2021/240574
PCT Pub. Date: Dec. 2, 2021

(65) Prior Publication Data
US 2023/0247868 A1  Aug. 3, 2023

(51) Int. Cl.
*G09G 3/3233* (2016.01)
*H10K 59/126* (2023.01)
*H10K 59/131* (2023.01)

(52) U.S. Cl.
CPC ......... *H10K 59/126* (2023.02); *G09G 3/3233* (2013.01); *H10K 59/131* (2023.02); *G09G 2300/0819* (2013.01); *G09G 2300/0842* (2013.01); *G09G 2300/0861* (2013.01);
(Continued)

(58) Field of Classification Search
CPC .. H10K 59/126; H10K 59/131; G09G 3/3233; G09G 2300/0819; G09G 2300/0842; G09G 2300/0861; G09G 2310/0202; G09G 2310/08; G09G 2360/14
See application file for complete search history.

(56) References Cited

U.S. PATENT DOCUMENTS

| | | |
|---|---|---|
| 10,163,984 B1 | 12/2018 | Ho et al. |
| 2009/0231511 A1 | 9/2009 | Takahashi et al. |
| 2012/0038605 A1 | 2/2012 | Han |

(Continued)

FOREIGN PATENT DOCUMENTS

| | | |
|---|---|---|
| JP | 2006-138953 A | 6/2006 |
| JP | 2009-223896 A | 10/2009 |

(Continued)

OTHER PUBLICATIONS

Official Communication issued in International Patent Application No. PCT/JP2020/020466, dated Aug. 25, 2020.

*Primary Examiner* — Sejoon Ahn
(74) *Attorney, Agent, or Firm* — Keating & Bennett, LLP

(57) ABSTRACT

In an organic EL display device including a proximity sensor, deterioration in display quality due to irradiation with IR light is suppressed. In the organic EL display device including the proximity sensor is provided with a light shielding unit that prevents a channel layer of a first initialization transistor from being irradiated with IR light, the first initialization transistor being provided in a pixel circuit in order to initialize a voltage that is applied to a control terminal of a drive transistor. The first initialization transistor preferably has a dual-gate structure. The first initialization transistor may have a LDD structure (including a one-side LDD structure).

15 Claims, 18 Drawing Sheets

(52) U.S. Cl.
CPC . *G09G 2310/0202* (2013.01); *G09G 2310/08* (2013.01); *G09G 2360/14* (2013.01)

(56) References Cited

U.S. PATENT DOCUMENTS

| | | | |
|---|---|---|---|
| 2015/0014681 | A1 | 1/2015 | Yamazaki |
| 2015/0070616 | A1 | 3/2015 | Ogasawara et al. |
| 2019/0259335 | A1* | 8/2019 | Yang ................. G09G 3/3225 |
| 2019/0259338 | A1* | 8/2019 | Li ..................... G09G 3/3266 |
| 2019/0259344 | A1* | 8/2019 | Shi ........................ G09G 3/20 |
| 2019/0259783 | A1* | 8/2019 | Baek .................... H10K 71/00 |
| 2019/0267573 | A1* | 8/2019 | Lee ................. H10K 59/1213 |
| 2020/0004381 | A1 | 1/2020 | Han et al. |
| 2020/0286435 | A1* | 9/2020 | Feng ..................... G09G 3/20 |

FOREIGN PATENT DOCUMENTS

| | | |
|---|---|---|
| JP | 2012-037857 A | 2/2012 |
| JP | 2013-038441 A | 2/2013 |
| JP | 2015-034979 A | 2/2015 |
| WO | 2013/157285 A1 | 10/2013 |

\* cited by examiner

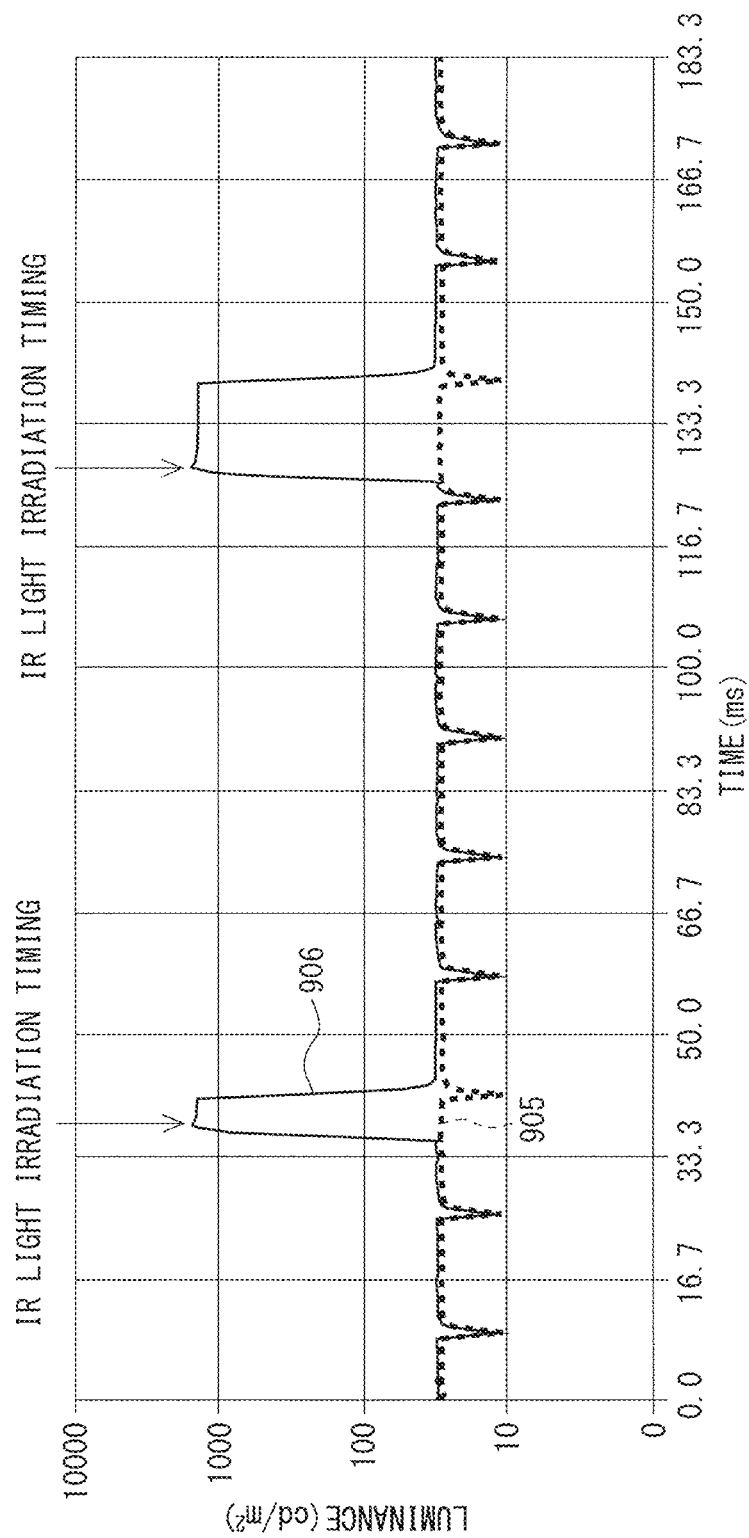

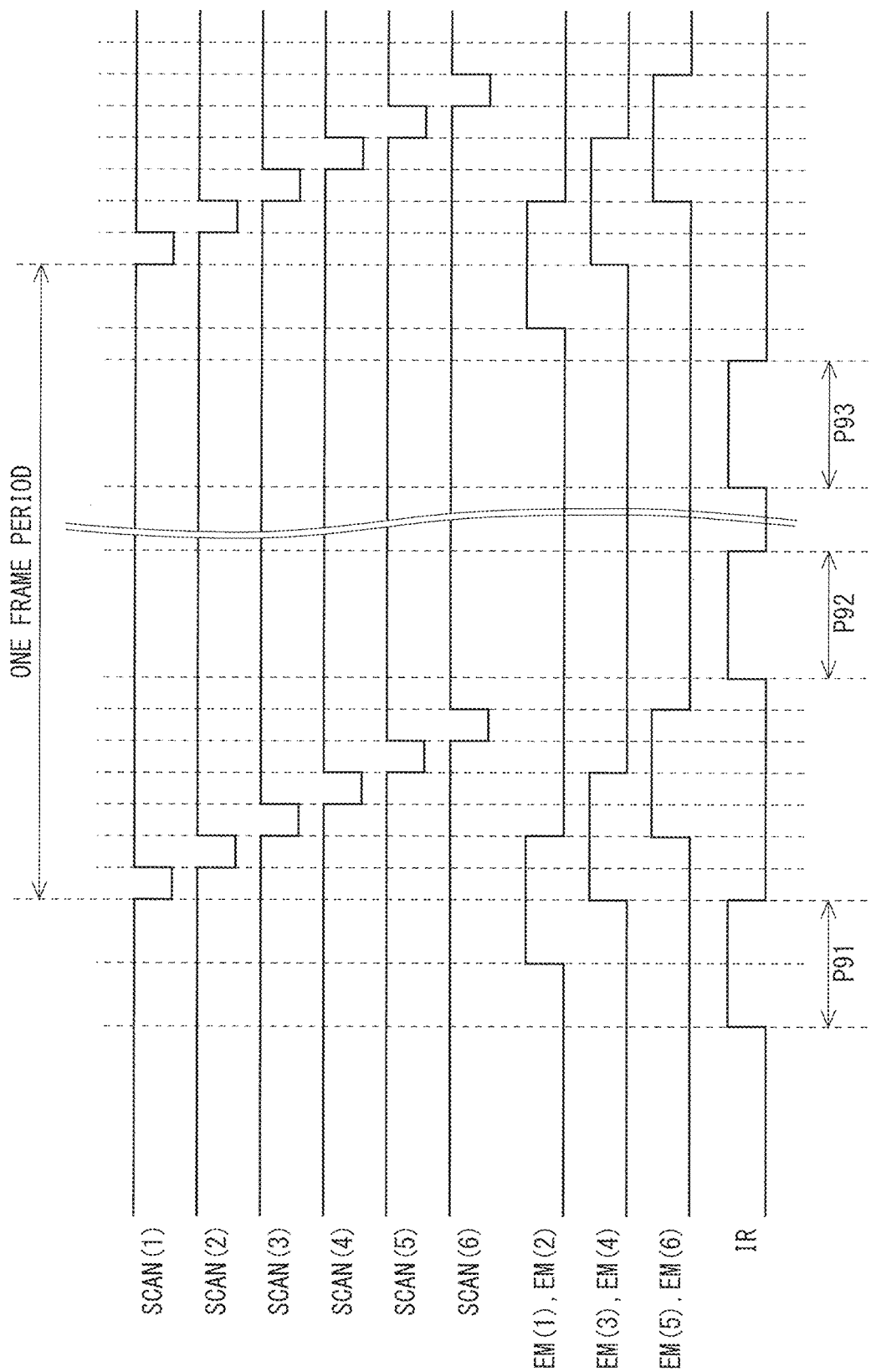

DISPLAY DEVICE

TECHNICAL FIELD

The following disclosure relates to a display device provided with a proximity sensor.

BACKGROUND ART

In recent years, an organic electroluminescent (EL) display device provided with a pixel circuit including an organic EL element has been put into practical use. The organic EL element is also called an organic light-emitting diode (OLED) and is a self-luminous display element that emits light with luminance corresponding to a current flowing therethrough. With the organic EL element being a self-luminous display element as described above, the organic EL display device can be easily reduced in thickness and power consumption and increased in luminance as compared to a liquid crystal display device that requires a backlight, a color filter, and the like.

Regarding the organic EL display device as described above, in recent years, the mounting of a proximity sensor that detects the presence or absence of an object at a close position has progressed. The proximity sensor mounted on the organic EL display device typically includes an emitting unit that emits infrared light (IR light) from the back surface of a display unit, and a light receiving unit that receives reflected light of the IR light. The presence or absence of an object at a close position is determined on the basis of the magnitude of a current generated in accordance with the amount of reflected light received by the light receiving unit.

An invention of a display device including the proximity sensor as described above is disclosed in Japanese Laid-Open Patent Publication No. 2009-223896. The display device disclosed in Japanese Laid-Open Patent Publication No. 2009-223896 has adopted a structure in which an infrared sensor as a proximity sensor is included in a display panel. In addition, as a content related to a configuration of an embodiment to be described later, Japanese Laid-Open Patent Publication No. 2013-38441 describes that a light shielding layer is provided in order to prevent light from a light source from being incident on a channel region of a thin-film transistor, although regarding a radiation detection device.

PRIOR ART DOCUMENT

Patent Documents

[Patent Document 1] Japanese Laid-Open Patent Publication No. 2009-223896
[Patent Document 2] Japanese Laid-Open Patent Publication No. 2013-38441

SUMMARY

Problems to be Solved by the Invention

By the way, regarding the organic EL display device provided with the proximity sensor, deterioration in display quality has become a problem. This will be described below, focusing on a case where a pixel circuit (a pixel circuit including one organic EL element 61, seven transistors T1 to T7 (first initialization transistor T1, threshold voltage compensation transistor T2, write control transistor T3, drive transistor T4, power supply control transistor T5, light-emission control transistor T6, second initialization transistor T7), and one holding capacitor Ca) 60 as illustrated in FIG. 17 is used.

In the present specification, for convenience, a state in which a data signal (display data) is being written into the pixel circuit 60 (a state in which the threshold voltage compensation transistor T2 and the write control transistor T3 are on) is referred to as "scan-on", and a state in which a data signal is not being written into the pixel circuit 60 (a state in which the threshold voltage compensation transistor T2 and the write control transistor T3 are off) is referred to as "scan-off". Further, for convenience, a state in which a drive current is being supplied to the organic EL element 61 (a state in which the power supply control transistor T5 and the light-emission control transistor T6 are on) is referred to as "emission-on", and a state in which the drive current is not being supplied to the organic EL element 61 (a state in which the power supply control transistor T5 and the light-emission control transistor T6 are off) is referred to as "emission-off". A region that is irradiated with the IR light emitted from the emitting unit of the proximity sensor in the entire display unit is referred to as an "IR light irradiation region (infrared light irradiation region)".

Hereinafter, attention is focused on the pixel circuit 60 in the IR light irradiation region. When the IR light irradiation is being performed, the on-currents and the off-currents of all the transistors T1 to T7 increase as compared with when the IR light irradiation is not being performed. In this regard, an influence on the display and the like varies depending on the IR light irradiation timing.

First, a description will be given of an influence on display or the like when the IR light irradiation is performed at the time of scan-off. In this case, as the off-currents of the first initialization transistor T1 and the threshold voltage compensation transistor T2 increase, the potential of a control node NG changes (a voltage between both ends of the holding capacitor Ca changes). Specifically, the potential of the control node NG decreases. Thereby, in the emission-on-state, the drive current passing through the power supply control transistor T5, the drive transistor T4, and the light-emission control transistor T6 relatively increases, and the characteristic of the drive transistor T4 changes. FIG. 18 is a diagram for explaining an example of a change in a current-voltage characteristic when a thin-film transistor is irradiated with IR light. FIG. 18 illustrates characteristics when LIPS-TFT (a thin-film transistor using low-temperature polysilicon for a channel layer) for testing is used in a saturation region with a drain-source voltage Vds set to −10 V. A solid line 901 indicates a characteristic in a case where the thin-film transistor is not irradiated with IR light, and a thick dotted line 902 indicates a characteristic in a case where the thin-film transistor is irradiated with the IR light. From the dotted line portion denoted by reference numeral 90, it is understood that the off-current greatly increases by the IR light irradiation.

Although the on-current and the off-current increase for all the transistors, the increase in the off-currents of the first initialization transistor T1 and the threshold voltage compensation transistor T2 greatly affects the display luminance. In this regard, when a thin-film transistor having a top gate structure has been adopted, the IR light is emitted from the back surface of the display unit, whereby the channel region of the thin-film transistor is irradiated with the IR light. This excites holes and electrons, resulting in a significant increase in off-current.

When the drive current increases as described above, the emission luminance of the organic EL element 61 becomes higher than the original luminance, and hence the display of the corresponding portion is visually recognized as a bright spot (the luminance of the pixel of the corresponding portion increases). FIG. 19 is a schematic diagram for explaining an increase in the luminance of a pixel. As illustrated in FIG. 19, a cover glass 91 is provided on the front surface of an organic EL module 92, and a protective sheet 93 is provided on the back surface thereof. A proximity sensor 94 is provided to be in contact with the protective sheet 93. The proximity sensor 94 includes an emitting unit 941 that emits infrared light and a light receiving unit 942 that receives reflected light of the infrared light. The organic EL element in the organic EL module 92 emits light, whereby lighting light is emitted from the display surface. In the IR light irradiation region, the drive current increases with the increase in the off-currents of the first initialization transistor T1 and the threshold voltage compensation transistor T2 as described above, such that the lighting light has high luminance.

Even when the IR light is turned off after the potential of the control node NG is changed by the IR light irradiation, the potential of the control node NG is maintained in the state after change. Therefore, even after the IR light is turned off, luminance display significantly different from desired luminance display is performed. This will be described with reference to FIGS. 20 and 21. A thick dotted line 903 in FIG. 20 and a thick dotted line 905 in FIG. 21 indicate the optical response of the display luminance in a case where the IR light irradiation is not performed, and a solid line 904 in FIG. 20 and a solid line 906 in FIG. 21 indicate the optical response of the display luminance in a case where the IR light irradiation is performed. Note that display with "white gradation value=255 (maximum gradation)" is performed in the case of FIG. 20, and display with "white gradation value=48" is performed in the case of FIG. 21. The IR light irradiation is performed at the timing of scan-off and emission-on with a pulse width of IR light of 1.9 ms and a duty ratio of 2.09%. It can be grasped from the thick dotted line 903 in FIG. 20 that the display luminance is maintained at about 1,000 cd/m² without the IR light irradiation when display with "white gradation value=255" is performed. As indicated by the solid line 904 in FIG. 20, when display with "white grayscale value=255" is performed, the display luminance increases to about 2,700 cd/m² at the IR light irradiation timing, and after the IR light is turned off, the display luminance slightly decreases but is maintained at about 2,500 cd/m² until the start of the next frame. Furthermore, from the thick dotted line 905 in FIG. 21, it can be grasped that the display luminance is maintained at about 30 cd/m² without the IR light irradiation when display with "white gradation value=48" is performed. As indicated by the solid line 906 in FIG. 21, when display with "white gradation value=48" is performed, the display luminance increases to about 1,400 cd/m² at the IR light irradiation timing, and the display luminance is maintained until the start time point of the next frame. As above, even after the IR light is turned off, luminance display significantly different from desired luminance display is performed.

When the drive current increases as described above, burn-in occurs due to high current stress at the corresponding portion after the IR light is turned off. Such burn-in can be visually recognized as a white spot or a black spot when the IR light is not emitted, depending on the surrounding luminance and the intensity of the IR light. That is, the burn-in causes deterioration in display quality.

Next, a description will be given of an influence on display or the like when the IR light irradiation is performed at the time of scan-on. In this case, the on-currents of the write control transistor T3, the drive transistor T4, and the threshold voltage compensation transistor T2 relatively increase during a period when the data signal is being written. Thus, the data signal is not written correctly, and desired gradation display is not performed until the data signal is written next (until the next frame period). For example, when a solid image is to be displayed, the display of the corresponding portion is different from the display around the portion. When the pixel circuit 60 illustrated in FIG. 17 has been adopted (when the drive transistor T4 is a P-channel transistor), the luminance of the corresponding portion becomes lower than the surrounding luminance, and the portion is instantaneously visually recognized by a viewer as a black spot (dirt). In this way, the display quality degrades.

FIG. 22 is a timing chart for explaining a known IR light irradiation timing. However, waveforms illustrated in FIG. 22 are an example, and it is assumed that a region in first to sixth rows in the display unit is an IR light irradiation region. A period in which a scanning signal SCAN is maintained at a high level is a scan-off period, and a period in which the scanning signal SCAN is maintained at a low level is a scan-on period. A period in which a light light-emission control signal EM is maintained at the high level is an emission-off period, and a period in which the light-emission control signal EM is maintained at the low level is an emission-on period. In the example illustrated in FIG. 22, the IR light irradiation is performed in periods indicated by arrows denoted by reference signs P91, P92, and P93. As described above, in related art, the IR light irradiation has been performed at any timing without synchronizing with a driving operation for image display. When the IR light irradiation is performed at any timing in this manner, for example, the pixel circuits 60 in the first row are irradiated with IR light at any one of the following timings (1) to (7).

(1) a period of scan-on and emission-off
(2) a period of scan-off and emission-off
(3) a period of scan-off and emission-on
(4) a period extending from above (1) to above (2)
(5) a period extending from above (2) to above (3)
(6) a period extending from above (3) to above (2)
(7) a period extending from above (2) to above (1)

The optical responses of the display luminance are different from each other in the above cases (1) to (7). For this reason, the luminance of a pixel in the IR light irradiation region may increase, or the luminance of the pixel in the IR light irradiation region may be lower than the luminance of surrounding pixels. In this way, the display quality degrades. For example, short-term burn-in occurs in a pixel with increased luminance. Then, in a period during which the IR light irradiation is not being performed, burn-in (white burn-in or black burn-in) is visually recognized in a spot shape in the IR light irradiation region. Further, long-term burn-in occurs due to the accumulation of the IR light irradiation to cause unrecoverable display defects.

Therefore, an object of the following disclosure is to suppress deterioration in display quality caused by IR light irradiation in a display device provided with a proximity sensor.

Means for Solving the Problems

A display device according to some embodiments of the present disclosure is a display device provided with a pixel circuit including a display element driven by a current, the display device including:

a display unit that includes
a plurality of the pixel circuits of a plurality of rows and a plurality of columns,
a plurality of data signal lines configured to supply data signals to a plurality of the pixel circuits in corresponding respective columns,
a plurality of scanning signal lines configured to control writing of the data signals into a plurality of the pixel circuits in corresponding respective rows,
a plurality of light-emission control lines configured to control whether to supply a current to the display element included in each of a plurality of the pixel circuits in the corresponding respective rows,
a first power line configured to supply a high-level power supply voltage,
a second power line configured to supply a low-level power supply voltage, and
an initialization power line configured to supply an initialization voltage; and
a proximity sensor that includes
an emitting unit configured to emit infrared light from a back surface of the display unit, and
a light receiving unit configured to receive reflected light of the infrared light, wherein
each pixel circuit includes
a control node,
the display element including a first terminal and a second terminal connected to the second power line,
a drive transistor having a control terminal connected to the control node, a first conduction terminal, and a second conduction terminal, the drive transistor being provided in series with the display element,
a light-emission control transistor having a control terminal connected to one of the plurality of light-emission control lines, a first conduction terminal, and a second conduction terminal, the light-emission control transistor being provided in series with the display element,
a holding capacitor having one end connected to the first power line and the other end connected to the control node,
a write control transistor having a control terminal connected to one of the plurality of scanning signal lines, a first conduction terminal connected to one of the plurality of data signal lines, and a second conduction terminal connected to the first conduction terminal of the drive transistor,
a threshold voltage compensation transistor having a control terminal connected to one of the plurality of scanning signal lines, a first conduction terminal connected to the second conduction terminal of the drive transistor, and a second conduction terminal connected to the control node, and
a first initialization transistor having a control terminal connected to one of the plurality of scanning signal lines, a first conduction terminal connected to the control node, and a second conduction terminal connected to the initialization power line, and
a first light shielding unit configured to prevent a channel layer of the first initialization transistor from being irradiated with the infrared light is provided.

Effects of the Invention

According to some embodiments of the present disclosure, the display device is provided with the first light shielding unit so as to prevent the channel layer of the first initialization transistor in the pixel circuit from being irradiated with the infrared light. Thus, even when the infrared light is emitted from the proximity sensor for sensing, the channel layer of the first initialization transistor is not irradiated with the infrared light, and hence the off-current of the first initialization transistor does not increase. Therefore, fluctuations in the voltage of the control terminal of the drive transistor due to the infrared light irradiation is suppressed. Thereby, deterioration in display quality is suppressed. As above, in the display device, deterioration in display quality caused by the infrared light irradiation is suppressed as compared with the known display device.

BRIEF DESCRIPTION OF THE DRAWINGS

FIG. 21 is a diagram for explaining the influence of the IR light irradiation on display luminance.

FIG. 22 is a timing chart for explaining a known IR light irradiation timing.

MODES FOR CARRYING OUT THE INVENTION

Embodiments will be described below with reference to the accompanying drawings. In the following description, it is assumed that i and j are integers of 2 or more, m is an integer of 1 or more and i or less, and n is an integer of 1 or more and j or less.

1. First Embodiment

<1.1 Overall Configuration>

Figure 2:
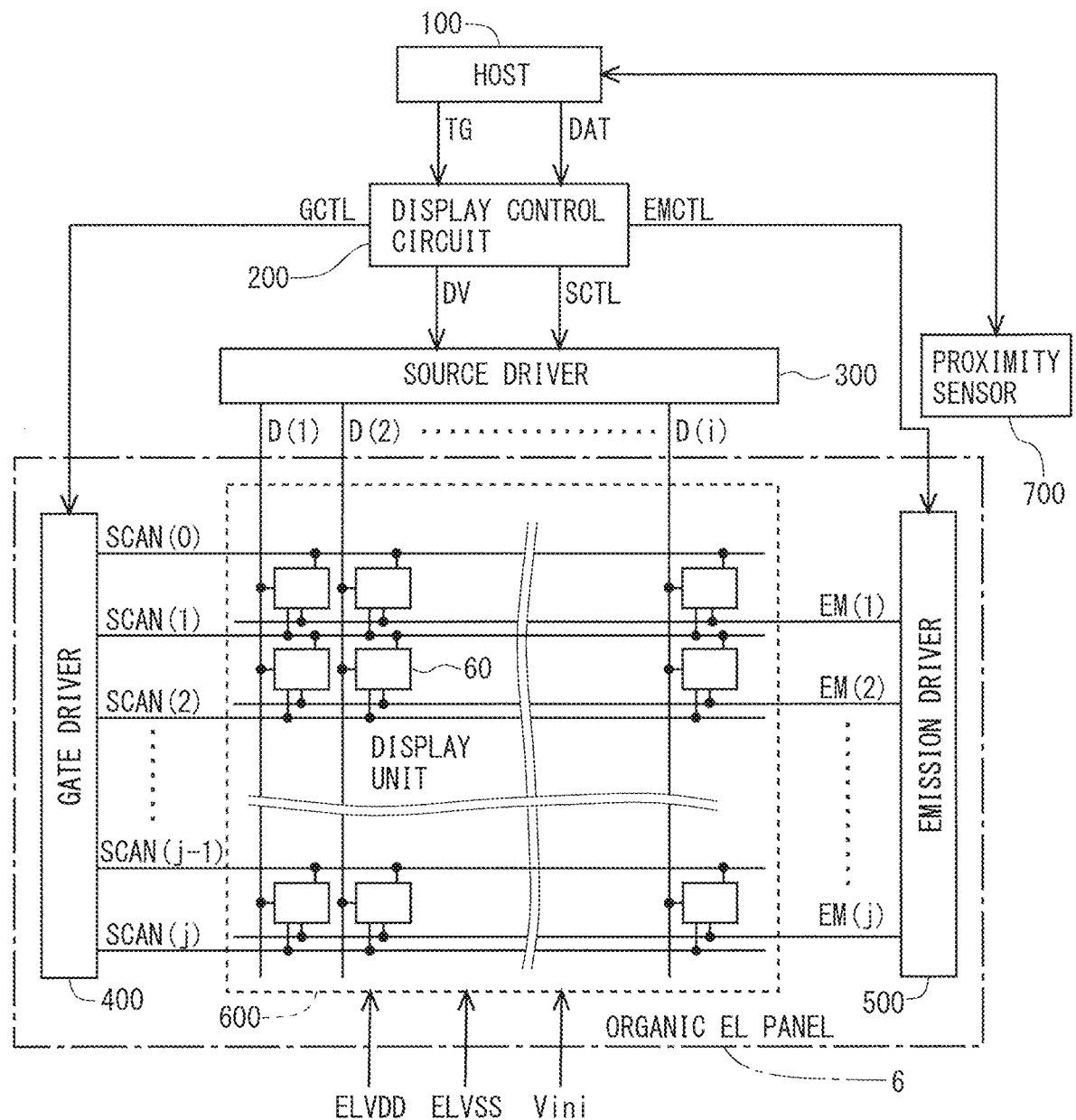
FIG. 2 is a block diagram illustrating an overall configuration of an organic EL display device according to the first embodiment.

FIG. 2 is a block diagram illustrating an overall configuration of the organic EL display device according to the first embodiment. As illustrated in FIG. 2, the organic EL display device includes a host 100, a display control circuit 200, a source driver (data signal line drive circuit) 300, a gate driver (scanning signal line drive circuit) 400, an emission driver (light-emission control line drive circuit) 500, a display unit 600, and a proximity sensor 700. In the present embodiment, the gate driver 400 and the emission driver 500 are formed in an organic EL panel 6 including the display unit 600. That is, the gate driver 400 and the emission driver 500 are monolithic. However, it is also possible to adopt a configuration in which the gate driver 400 and the emission driver 500 are not monolithic.

In the display unit 600, i data signal lines D(1) to D(i) and (j+1) scanning signal lines SCAN(0) to SCAN(j) orthogonal thereto are disposed. In the display unit 600, j light-emission control lines EM(1) to EM(j) are disposed to have a one-to-one correspondence with the j scanning signal lines SCAN(1) to SCAN(j) except for the scanning signal line SCAN(0). The scanning signal lines SCAN(0) to SCAN(j) and the light-emission control lines EM(1) to EM(j) are parallel to each other. Furthermore, in the display unit 600, i×j pixel circuits 60 are provided to correspond to the intersections of the i data signal lines D(1) to D(i) and the j scanning signal lines SCAN(1) to SCAN(j). By providing the i×j pixel circuits 60 in this manner, a pixel matrix of i columns and j rows is formed in the display unit 600. In the following, reference signs SCAN(0) to SCAN(j) may also be attached to scanning signals respectively provided to the (j+1) scanning signal lines SCAN(0) to SCAN(j), reference signs EM(1) to EM(j) may also be attached to light-emission control signals respectively provided to the j light-emission control lines EM(1) to EM(j), and reference signs D(1) to D(i) may also be attached to data signals respectively provided to the i data signal lines D(1) to D(i).

In the display unit 600, power lines (not illustrated) common to all the pixel circuits 60 are disposed. More specifically, a power line (hereinafter referred to as a "high-level power line") that supplies a high-level power supply voltage ELVDD for driving the organic EL element, a power line (hereinafter referred to as a "low-level power line") that supplies a low-level power supply voltage ELVSS for driving the organic EL element, and a power line (hereinafter referred to as an "initialization power line") that supplies an initialization voltage Vini are disposed. Note that the high-level power line is denoted by the same reference sign ELVDD as the high-level power supply voltage, the low-level power line is denoted by the same reference sign ELVSS as the low-level power supply voltage, and the initialization power line is denoted by the same reference sign Vini as the initialization voltage. The high-level power supply voltage ELVDD, the low-level power supply voltage ELVSS, and the initialization voltage Vini are supplied from a power supply circuit (not illustrated). In the present embodiment, a first power line is achieved by the high-level power line ELVDD, and a second power line is achieved by the low-level power line ELVSS.

As will be described later, in the present embodiment, two adjacent light-emission control lines EM are grouped together as a set, and light-emission control signals having the same waveform are provided to two light-emission control lines EM of the same set. Therefore, the number of light-emission control lines EM in the display unit 600 may be set to (j/2), and one light-emission control line EM may be branched into two lines in the vicinity of the pixel circuit 60.

Hereinafter, the operation of each component illustrated in FIG. 2 will be described. The host 100 provides image data DAT and a timing signal group (horizontal synchronization signal, vertical synchronization signal, etc.) TG to the display control circuit 200. The host 100 also controls the operation of the proximity sensor 700 (e.g., controls an emission timing of IR light) and receives, from the proximity sensor 700, result data (data indicating whether or not an object exists at a close position) obtained by sensing.

The display control circuit 200 receives the image data DAT and the timing signal group TG which are transmitted from the host 100 and outputs a digital video signal DV, a source control signal SCTL for controlling the operation of the source driver 300, a gate control signal GCTL for controlling the operation of the gate driver 400, and an emission driver control signal EMCTL for controlling the operation of the emission driver 500. The source control signal SCTL includes a source start pulse signal, a source clock signal, a latch strobe signal, and the like. The gate control signal GCTL includes a gate start pulse signal, a gate clock signal, and the like. The emission driver control signal EMCTL includes an emission start pulse signal, an emission clock signal, and the like.

The source driver 300 is connected to the i data signal lines D(1) to D(i). The source driver 300 receives the digital video signal DV and the source control signal SCTL which are outputted from the display control circuit 200 and applies data signals to the i data signal lines D(1) to D(i). The source driver 300 includes an i-bit shift register, a sampling circuit, a latch circuit, i D/A converters, and the like (not illustrated). The shift register has i registers that are cascade-connected. The shift register sequentially transfers the pulse of the source start pulse signal supplied to the first-stage register from the input terminal to the output terminal on the basis of the source clock signal. The sampling pulse is outputted from each stage of the shift register in accordance with the transfer of the pulse. On the basis of the sampling pulse, the sampling circuit stores the digital video signal DV. The latch circuit captures and holds digital video signals DV for one row stored in the sampling circuit in accordance with the latch strobe signal. The D/A converter is provided to correspond to each of the data signal lines D(1) to D(i). The D/A converter converts the digital video signal DV held in the latch circuit into an analog voltage. The converted analog voltages are simultaneously applied to all the data signal lines D(1) to D(i) as data signals.

The gate driver 400 is connected to the (j+1) scanning signal lines SCAN(0) to SCAN(j). The gate driver 400 includes a shift register, a logic circuit, and the like. The gate driver 400 drives the (j+1) scanning signal lines SCAN(0) to SCAN(j) on the basis of the gate control signal GCTL outputted from the display control circuit 200.

The emission driver 500 is connected to the j light-light-emission control lines EM(1) to EM(j). The emission driver 500 includes a shift register, a logic circuit, and the like. The emission driver 500 drives the j light-emission control lines EM(1) to EM(j) on the basis of the emission driver control signal EMCTL outputted from the display control circuit 200.

The proximity sensor 700 detects the presence or absence of an object at a position close to the organic EL display device. Note that details of the proximity sensor 700 will be described later.

The i data signal lines D(1) to D(i), the (j+1) scanning signal lines SCAN(0) to SCAN(j), and the j light-emission control lines EM(1) to EM(j) are driven as described above, whereby an image based on the image data DAT is displayed on the display unit 600. Further, by the sensing by the proximity sensor 700, it is determined whether or not an object exists at a position close to the organic EL display device.

<1.2 Proximity Sensor>

Figure 3:
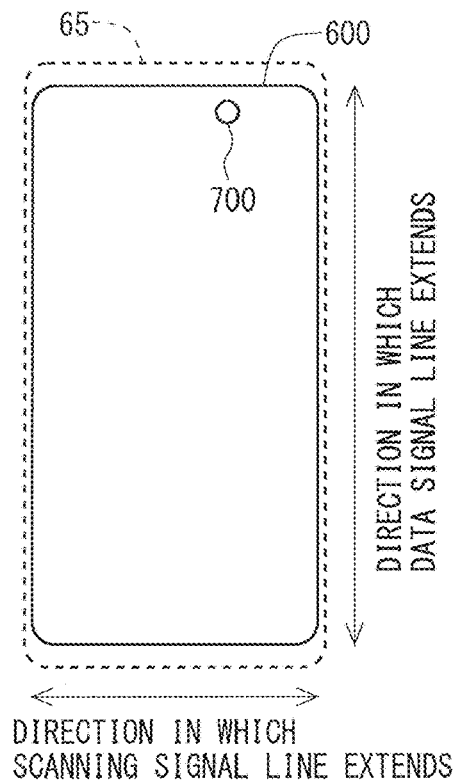
FIG. 3 is a diagram for explaining a position where a proximity sensor is provided in the first embodiment.
Figure 4:
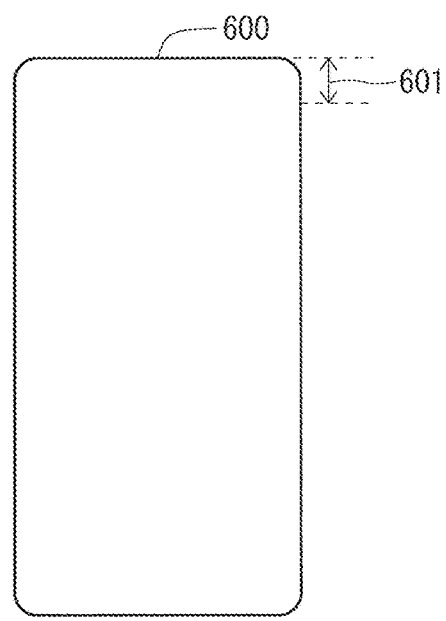
FIG. 4 is a diagram for explaining an IR light irradiation region in the first embodiment.

FIG. 3 is a diagram for explaining a position where the proximity sensor 700 is provided. In FIG. 3, a dotted line denoted by reference numeral 65 represents the housing of the organic EL display device. The proximity sensor 700 is provided, on the back surface of the display unit 600, on one end side in a direction in which the data signal lines D(1) to D(i) extend. With the proximity sensor 700 being disposed in this manner, in the present embodiment, a region indicated by an arrow denoted by reference numeral 601 in FIG. 4 is an IR light irradiation region. It is assumed here that a region in first to sixth rows in the display unit 600 is the IR light irradiation region 601.

Figure 5:
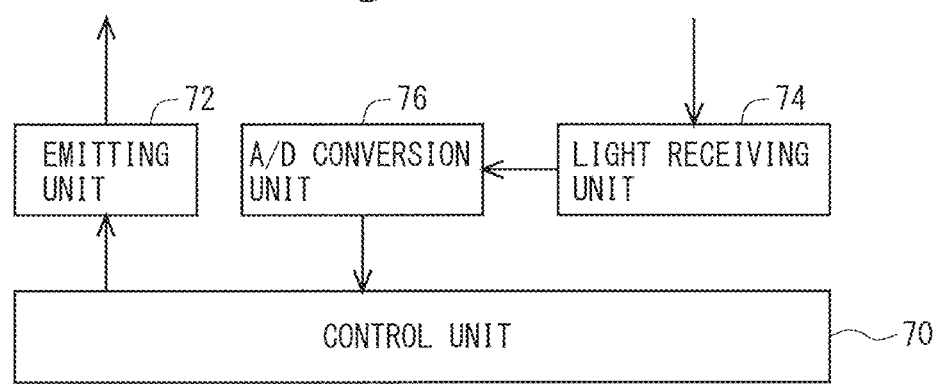
FIG. 5 is a block diagram illustrating the functional configuration of the proximity sensor in the first embodiment.

FIG. 5 is a block diagram illustrating the functional configuration of the proximity sensor 700. As illustrated in FIG. 5, the proximity sensor 700 includes a control unit 70, an emitting unit 72, a light receiving unit 74, and an analog-to-digital (A/D) conversion unit 76. The emitting unit 72 emits infrared light (IR light) from the back surface of the display unit 600. The emitting unit 72 is constituted by, for example, an infrared light-emitting diode (LED) and receives the supply of a current from the control unit 70 to emit IR light. The light receiving unit 74 receives the reflected light of the IR light emitted from the emitting unit 72. The light receiving unit 74 is constituted by, for example, a photodiode and generates a measurement current corresponding to the amount of received light. The A/D conversion unit 76 performs A/D conversion on the basis of the measurement current and outputs a digital signal. The control unit 70 controls the emission timing of the IR light from the emitting unit 72. Specifically, the control unit 70 supplies a predetermined current to the emitting unit 72 at the timing for causing the emitting unit 72 to emit the IR light. The control unit 70 also determines whether or not an object exists at a position close to the organic EL display device on the basis of the digital signal outputted from the A/D conversion unit 76.

Note that two or more proximity sensors 700 may be provided in the organic EL display device. However, even in such a case, it is assumed that only one proximity sensor 700 emits the IR light.

<1.3 Pixel Circuit and Light Shielding Unit>
<1.3.1 Configuration of Pixel Circuit>

Figure 1:
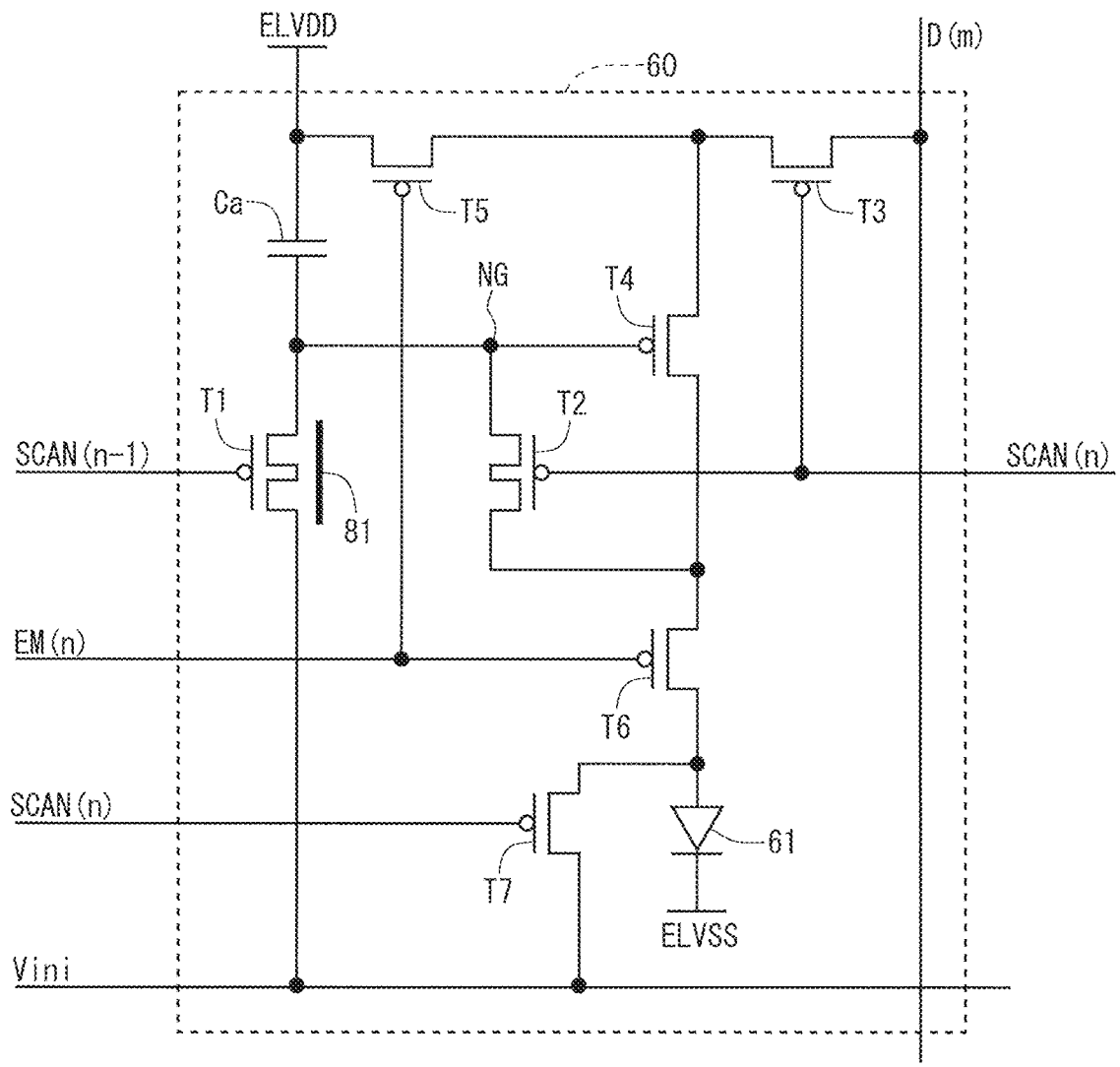
FIG. 1 is a circuit diagram illustrating a configuration of a pixel circuit in an nth row and an mth column in a first embodiment.

Next, the configuration of the pixel circuit 60 in the display unit 600 will be described. FIG. 1 is a circuit diagram illustrating a configuration of a pixel circuit 60 in an nth row and an mth column. The pixel circuit 60 includes one organic EL element (organic light-emitting diode) 61 as a display element (a display element driven by a current), seven transistors (typically thin-film transistors) T1 to T7 (first initialization transistor T1, threshold voltage compensation transistor T2, write control transistor T3, drive transistor T4, power supply control transistor T5, light-emission control transistor T6, second initialization transistor T7), and one holding capacitor Ca. The holding capacitor Ca is a capacitive element made up of two electrodes (first electrode and second electrode). The transistors T1 to T7 are P-channel transistors. The first initialization transistor T1 and the threshold voltage compensation transistor T2 have a dual-gate structure in which two transistors are connected in series. By adopting such a dual-gate structure, it is possible to obtain the effects of improving the breakdown voltage of the transistor and reducing the off-current.

Concerning the configuration illustrated in FIG. 1, a node connected to the first conduction terminal of the first initialization transistor T1, the second conduction terminal of the threshold voltage compensation transistor T2, the control terminal of the drive transistor T4, and the second electrode of the holding capacitor Ca is referred to as a "control node". The control node is denoted by reference sign NG.

Note that the configuration illustrated in FIG. 1 is an example, and it is not limited to this. For example, a pixel circuit including only an N-channel transistor can be adopted, or a pixel circuit in which a P-channel transistor and an N-channel transistor are mixed can be adopted. The first initialization transistor T1 and the threshold voltage compensation transistor T2 may not have a dual-gate structure. Further, for example, the configuration in which the second initialization transistor T7 among seven transistors is not provided can be adopted.

The first initialization transistor T1 has a control terminal connected to the scanning signal line SCAN(n−1) in the (n−1)th row, a first conduction terminal connected to the control node NG, and a second conduction terminal connected to the initialization power line Vini. The threshold voltage compensation transistor T2 has a control terminal connected to the scanning signal line SCAN(n) in the nth row, a first conduction terminal connected to the second conduction terminal of the drive transistor T4 and the first conduction terminal of the light-emission control transistor T6, and a second conduction terminal connected to the control node NG. The write control transistor T3 has a control terminal connected to the scanning signal line SCAN (n) in the nth row, a first conduction terminal connected to the data signal line D(m) in the mth column, and a second conduction terminal connected to the first conduction terminal of the drive transistor T4 and a second conduction terminal of the power supply control transistor T5. The drive transistor T4 has a control terminal connected to the control node NG, the first conduction terminal connected to the second conduction terminal of the write control transistor T3 and the second conduction terminal of the power supply control transistor T5, and the second conduction terminal connected to the first conduction terminal of the threshold voltage compensation transistor T2 and the first conduction terminal of the light-emission control transistor T6.

The power supply control transistor T5 has a control terminal connected to the light-emission control line EM(n) in the nth row, a first conduction terminal connected to the high-level power line ELVDD and the first electrode of the holding capacitor Ca, and the second conduction terminal connected to the second conduction terminal of the write control transistor T3 and the first conduction terminal of the drive transistor T4. The light-emission control transistor T6 has a control terminal connected to the light-emission control line EM(n) in the nth row, the first conduction terminal connected to the first conduction terminal of the threshold voltage compensation transistor T2 and the second conduction terminal of the drive transistor T4, and a second conduction terminal connected to the first conduction terminal of the second initialization transistor T7 and the anode terminal (first terminal) of the organic EL element 61. The second initialization transistor T7 has a control terminal connected to the scanning signal line SCAN(n) in the nth row, the first conduction terminal connected to the second conduction terminal of the light-emission control transistor T6 and the anode terminal of the organic EL element 61, and a second conduction terminal connected to the initialization power line Vini. The holding capacitor Ca has the first electrode connected to the high-level power line ELVDD and the first conduction terminal of the power supply control transistor T5, and the second electrode connected to the control node NG. The organic EL element 61 has the anode terminal connected to the second conduction terminal of the light-emission control transistor T6 and the first conduction terminal of the second initialization transistor T7, and a cathode terminal (second terminal) connected to the low-level power line.

<1.3.2 Light Shielding Unit>

In the present embodiment, a light shielding unit 81 for preventing the channel layer of the first initialization transistor T1 from being irradiated with the IR light (the IR light emitted from the emitting unit 72 of the proximity sensor 700) is provided (cf. FIG. 1). This will be described below. Note that a first light shielding unit is achieved by the light shielding unit 81.

Figure 6:
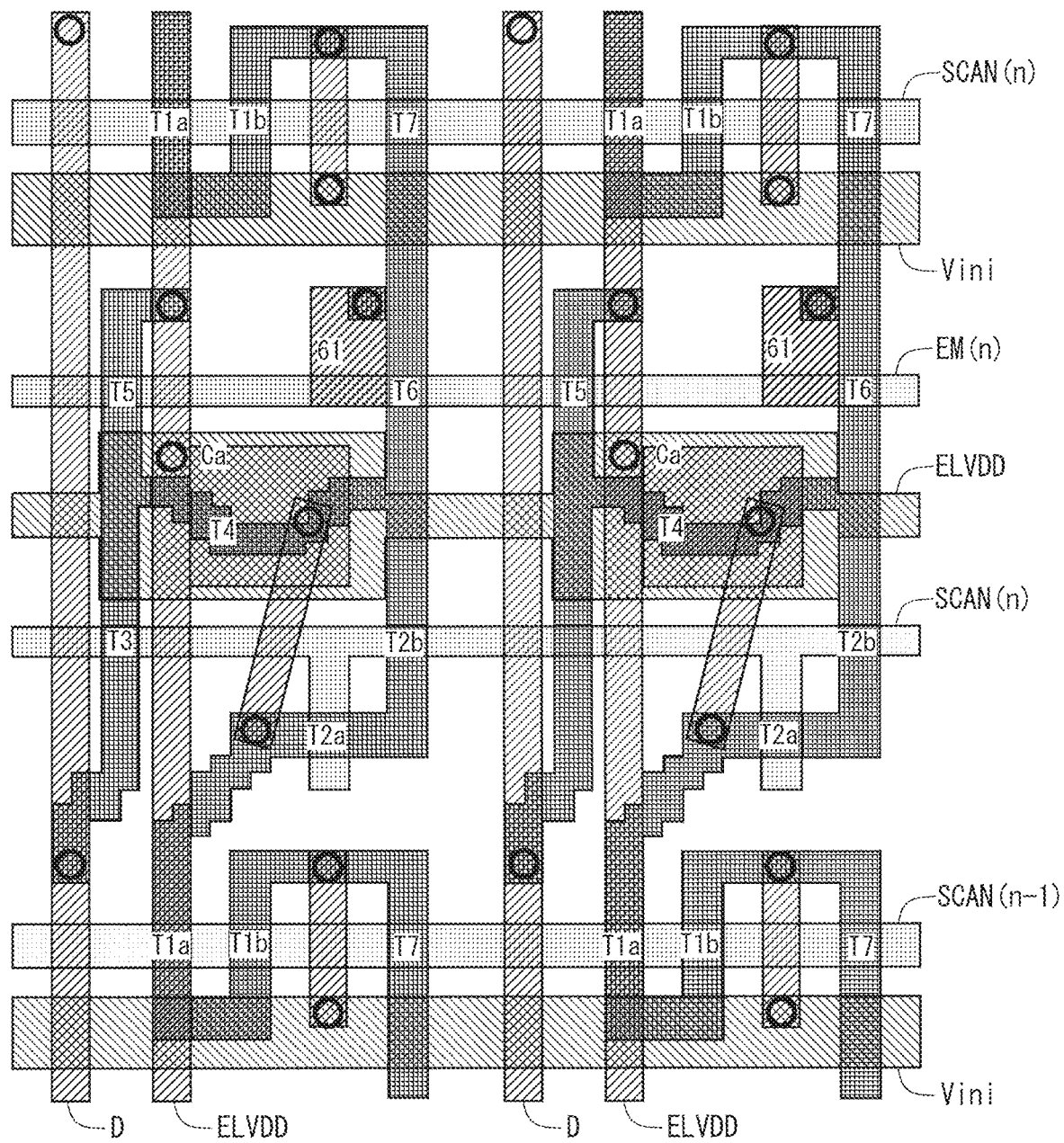
FIG. 6 is a layout diagram of the pixel circuit according to the first embodiment.

FIG. 6 is a layout diagram of the pixel circuit 60. In FIG. 6, a contact hole for electrically connecting wiring or the like of a certain layer to wiring or the like of another layer is formed at a thick circle portion. One of the two transistors constituting the first initialization transistor T1 having the dual-gate structure is denoted by reference sign T1a, and the other is denoted by reference sign T1b. Similarly, one of the two transistors constituting the threshold voltage compensation transistor T2 having the dual-gate structure is denoted by reference sign T2a, and the other is denoted by reference sign T2b. It can be grasped from FIG. 6 that, for example, the scanning signal line SCAN and the light-emission control line EM are disposed in the same layer, the initialization power line Vini and the high-level power line ELVDD extending in the horizontal direction in the figure are disposed in the same layer, and the data signal line D and the high-level power line ELVDD extending in the vertical direction in the figure are disposed in the same layer. Note that the layout diagram illustrated here is an example, and it is not limited to this.

Figure 7:
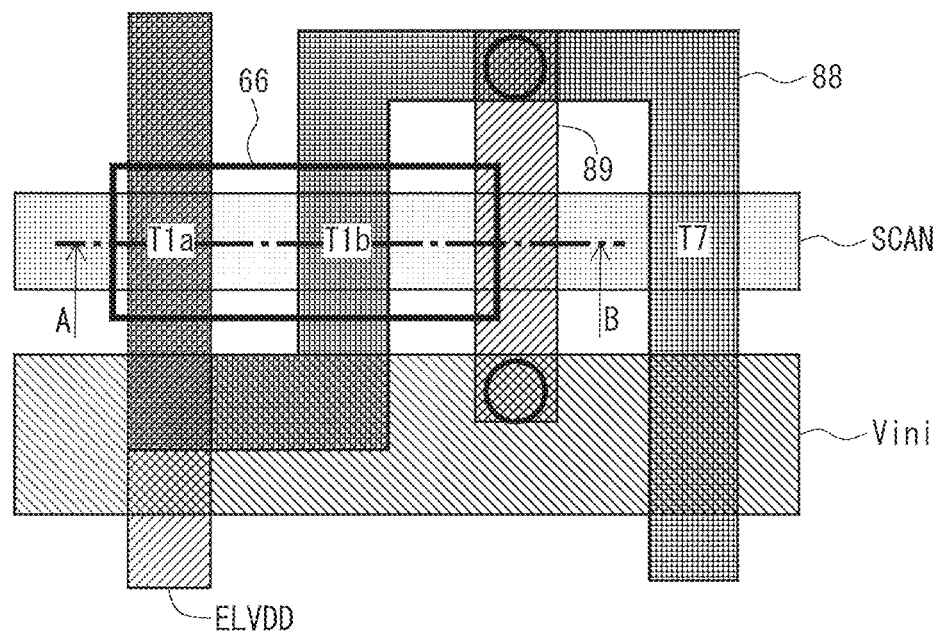
FIG. 7 is a diagram for explaining a placement position of a light shielding unit for a first initialization transistor in the first embodiment.

FIG. 7 is an enlarged view of the vicinity of one first initialization transistor T1 in the layout diagram illustrated in FIG. 6. Metal wiring 89 and the high-level power line ELVDD are disposed in the same layer. Wiring (one obtained by converting a semiconductor layer into a conductor by predetermined processing) 88, the source electrode and the drain electrode of the transistor T1a, and the source electrode and the drain electrode of the transistor T1b are disposed in the same layer. In the above configuration, for example, the light shielding unit 81 is provided in a region within a thick frame denoted by reference numeral 66. In this manner, in the present embodiment, one light shielding unit 81 is provided in an island shape corresponding to the pixel circuit 60.

Figure 8:
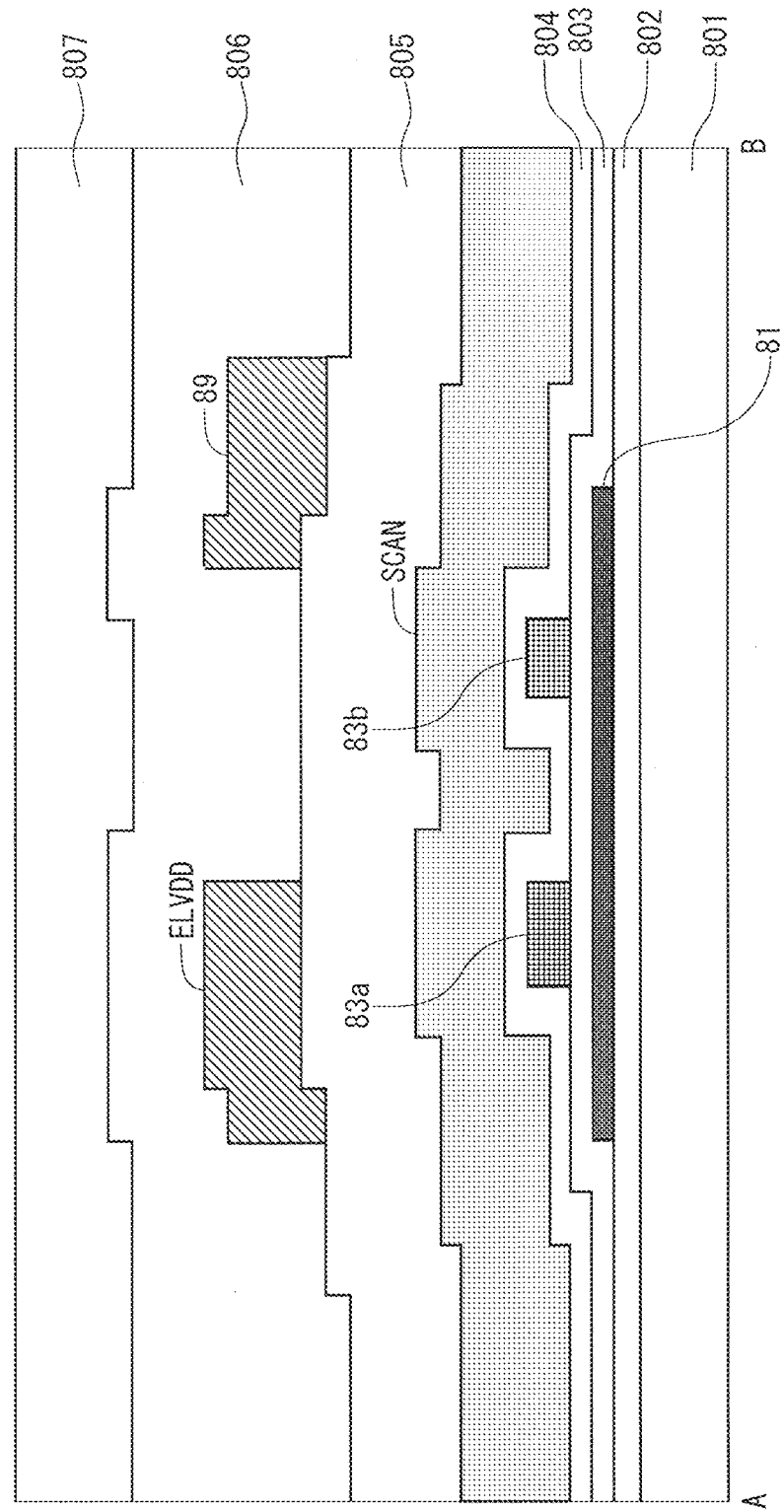
FIG. 8 is a cross-sectional view taken along line A-B in FIG. 7.

FIG. 8 is a cross-sectional view taken along line A-B in FIG. 7. As illustrated in FIG. 8, an insulating film 802 and an insulating film 803 are formed on a substrate 801. A semiconductor layer 83a and a semiconductor layer 83b are formed on the insulating film 803. The semiconductor layers 83a, 83b are the same layer as the wiring 88 and function as a channel region or a drain-source region depending on processing. A gate insulating film 804 is formed to cover the semiconductor layers 83a, 83b and the insulating film 803, and metal wiring as the scanning signal line SCAN is formed on the gate insulating film 804. An insulating film 805 is formed on the metal wiring as the scanning signal line SCAN, and metal wiring 89 and metal wiring as the high-level power line ELVDD are formed on the insulating film 805. Then, an insulating film 806 is formed to cover the metal wiring 89, the metal wiring as the high-level power line ELVDD, and the insulating film 805, and an insulating film 807 is formed on the insulating film 806. Here, as illustrated in FIG. 8, the light shielding unit 81 is formed on the insulating film 802 to prevent the semiconductor layer 83a and the semiconductor layer 83b from being irradiated with the IR light (the IR light emitted from the emitting unit 72 of the proximity sensor 700). That is, the light shielding unit 81 is provided to prevent the channel layer of the first initialization transistor T1 from being irradiated with the IR light.

Meanwhile, as a member embodying the light shielding unit 81, for example, a plate-shaped metal member made of the same material as the scanning signal line SCAN, a plate-shaped resin member having a property of absorbing IR light, a plate-shaped resin member having a property of scattering IR light, or the like can be adopted.

It is also possible to adopt a configuration in which a metal member is adopted as a member embodying the light shielding unit 81, and then the metal member (light shielding unit 81) is electrically connected to the first conduction terminal or the second conduction terminal of the first initialization transistor T1. Thereby, the light shielding unit 81 functions as a back gate electrode, and the characteristics of the first initialization transistor T1 can be stabilized.

Note that the light shielding unit 81 is preferably provided not only for the first initialization transistor T1 in the IR light irradiation region 601 but for all the first initialization transistors T1 in the display unit 600. This is because the characteristics can be made uniform, and the manufacturing process can be made common.

Here, a description will be given of the reason why the light shielding unit 81 is provided only for the first initialization transistor T1 among the seven transistors T1 to T7 in the pixel circuit 60. The organic EL display device according to the present embodiment includes the proximity sensor 700. In order to achieve the sensing by the proximity sensor 700, it is necessary to transmit the IR light from the back surface to the front surface of the display unit 600 and further transmit reflected light from the front surface to the back surface (specifically, the light receiving unit 74) of the display unit 600. Therefore, it is preferable that the aperture ratio (the ratio of the region where the circuit element and the wiring are provided to the entire region of the pixel circuit 60) is high. However, in the pixel circuit of the organic EL display device, the density of the transistors and the wirings is remarkably high as compared with a pixel circuit of a liquid crystal display device. For example, for a certain pixel circuit having a pixel density of 500 ppi, the aperture ratio is about 10%. Further, the diffraction and scattering of the IR light occur due to the presence of a large number of wiring gaps (e.g., 0.1 to 5.0 μm) having a size close to the wavelength (e.g., 940 nm) of the IR light. This leads to great attenuation of the IR light traveling from the back surface to the front surface of the display unit 600. From the above, it is not possible to adopt a configuration in which the light shielding unit is provided for most of the pixel circuit 60 or a configuration in which the light shielding unit is provided for all the transistors in the pixel circuit 60. In a case where a back gate electrode is provided in a transistor, a metal electrode layer having a sufficient size is required to secure a contact region, and hence a transistor provided with the light shielding unit is limited in a high-definition pixel. In view of the above points, it is preferable to provide the light shielding unit for a transistor that most affects display by the IR light irradiation. Specifically, it is preferable to provide the light shielding unit for a transistor having a conduction terminal connected to the holding capacitor Ca for holding a voltage throughout a frame period after the writing of a data signal into the pixel circuit 60. Therefore, as described above, the light shielding unit 81 is provided only for the first initialization transistor T1 among the seven transistors T1 to T7 in the pixel circuit 60.

<1.3.3 LDD Structure>

As described above, an increase in the off-current of the first initialization transistor T1 causes deterioration in display quality. Therefore, an LDD structure may be adopted for the first initialization transistor T1 in order to suppress an increase in off-current. This will be described below. Note that LDD is an abbreviation for "Lightly Doped Drain".

Figure 9:
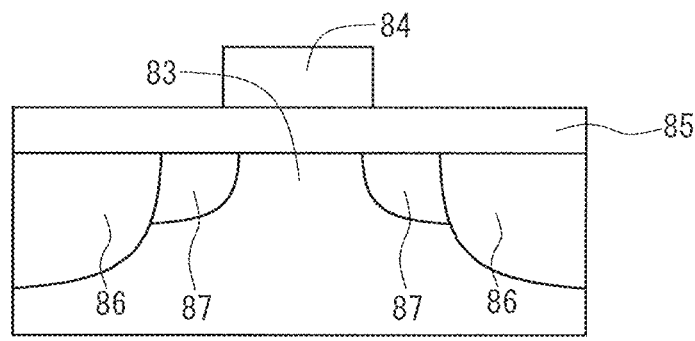
FIG. 9 is a schematic cross-sectional view for explaining a lightly doped drain (LDD) structure according to the first embodiment.

FIG. 9 is a schematic cross-sectional view for explaining an LDD structure. A gate electrode 84 is formed on a gate insulating film 85 similarly to a general structure. Under the gate insulating film 85, an LDD region 87 containing a low-concentration impurity is provided between the channel region (channel layer) 83 and the drain-source region 86 containing a high-concentration impurity. With such an LDD structure, an effect of reducing a drain electric field and reducing a leakage current can be obtained.

Figure 10:
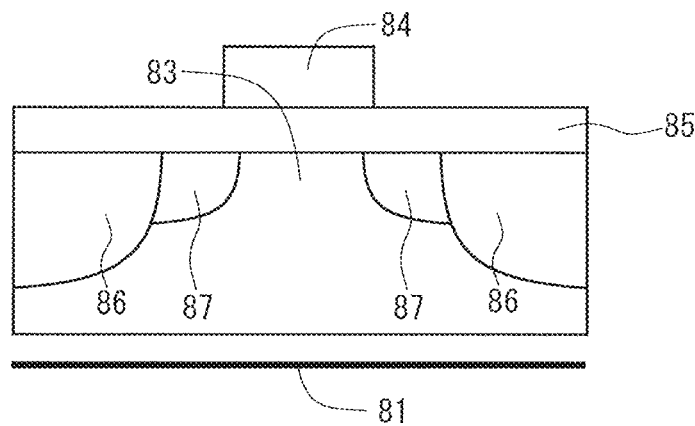
FIG. 10 is a diagram for explaining the placement of the light shielding unit when the LDD structure is adopted in the first embodiment.

When the LDD structure is adopted as the structure of the first initialization transistor T1, for example, as illustrated in FIG. 10, the light shielding unit 81 may be provided such that the entire channel region (channel layer) 83 is shielded from light.

Figure 11:
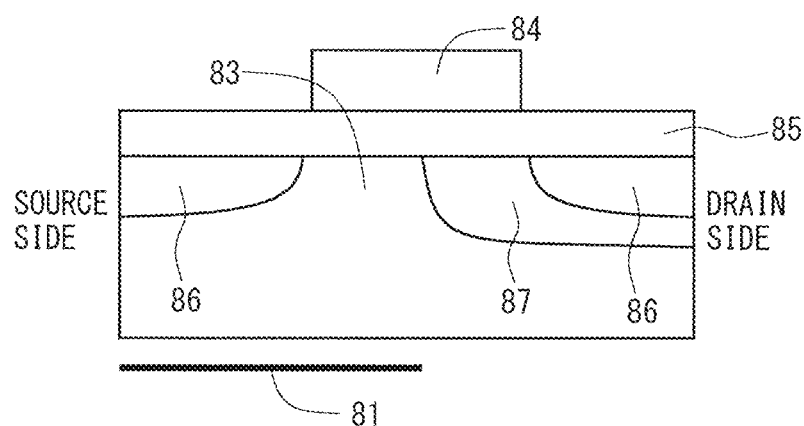
FIG. 11 is a diagram for explaining the placement of the light shielding unit when the one-side LDD structure is adopted in the first embodiment.

Further, for the first initialization transistor T1, a structure called "one-side LDD structure" in which the LDD region 87 is provided only on the drain side may be adopted. In this case, the light shielding unit 81 may be provided such that the entire channel region (channel layer) 83 is shielded from light, or the light shielding unit 81 may be provided such that the source-side region of the entire channel region (channel layer) 83 is shielded from light as illustrated in FIG. 11. As above, for the first initialization transistor T1, the one-side LDD structure having the LDD structure only for one of the first conduction terminal side and the second conduction terminal side may be adopted, and in this case, the light shielding unit 81 may be provided on the side not having the LDD structure out of the first conduction terminal side and the second conduction terminal side.

<1.3.4 Operation of Pixel Circuit>

Next, the operation of the pixel circuit 60 will be described with reference to FIG. 12. Here, attention is focused on the pixel circuits 60 in the nth row and the (n+1)th row to which the light-emission control signals EM having the same waveform are provided.

In a period prior to a time immediately before time t00, the scanning signals SCAN(n−1), SCAN(n), SCAN(n+1) are at a high level, and the light-emission control signals EM(n), EM(n+1) are at a low level. In this period, in both the pixel circuit 60 in the nth row and the pixel circuit 60 in the (n+1)th row, the power supply control transistor T5 and the light-emission control transistor T6 are in an on-state, and the organic EL element 61 is emitting light in accordance with the magnitude of the drive current.

At time t00, the light-emission control signals EM(n), EM(n+1) change from the low level to the high level. Thereby, in both the pixel circuit 60 in the nth row and the pixel circuit 60 in the (n+1)th row, the power supply control transistor T5 and the light-emission control transistor T6 come into the off-state. As a result, the supply of the current to the organic EL element 61 is cut off, and the organic EL element 61 comes into a turn-off state.

At time t01, the scanning signal SCAN(n−1) changes from the high level to the low level. Thus, in the pixel circuit 60 in the nth row, the first initialization transistor T1 comes into the on-state, and the gate voltage of the drive transistor T4 (the voltage of the control node NG) is initialized. That is, the gate voltage of the drive transistor T4 in the pixel circuit 60 in the nth row becomes equal to the initialization voltage Vini.

At time t02, the scanning signal SCAN(n−1) changes from the low level to the high level. Thus, in the pixel circuit 60 in the nth row, the first initialization transistor T1 comes into the off-state. At time t02, the scanning signal SCAN(n) changes from the high level to the low level. Thus, in the pixel circuit 60 in the nth row, the threshold voltage compensation transistor T2, the write control transistor T3, and the second initialization transistor T7 come into the on-state. By the threshold voltage compensation transistor T2 and the write control transistor T3 coming into the on-state, the data signal D(m) is provided to the control node NG via the write control transistor T3, the drive transistor 14, and the threshold voltage compensation transistor T2. As a result, the holding capacitor Ca is charged. By the second initialization transistor T7 coming into the on-state, the anode voltage of the organic EL element 61 is initialized on the basis of the initialization voltage Vini. In the pixel circuit 60 in the (n+1)th row, by the scanning signal SCAN(n) changing from the high level to the low level, the first initialization transistor T1 comes into the on-state, and the gate voltage of the drive transistor T4 is initialized. That is, the gate voltage of the drive transistor 14 in the pixel circuit 60 in the (n+1)th row becomes equal to the initialization voltage Vini.

At time t03, the scanning signal SCAN(n) changes from the low level to the high level. Thus, in the pixel circuit 60 in the nth row, the threshold voltage compensation transistor T2, the write control transistor T3, and the second initialization transistor T7 come into the off-state. At this time, in the pixel circuit 60 in the (n+1)th row, the first initialization transistor T1 comes into the off-state. Furthermore, at time t03, the scanning signal SCAN(n+1) changes from the high level to the low level. Thus, in the pixel circuit 60 in the (n+1)th row, the threshold voltage compensation transistor T2, the write control transistor T3, and the second initialization transistor T7 come into the on-state. By the threshold voltage compensation transistor T2 and the write control transistor T3 coming into the on-state, the data signal D(m) is provided to the control node NG via the write control transistor T3, the drive transistor T4, and the threshold voltage compensation transistor T2. As a result, the holding capacitor Ca is charged. By the second initialization transistor T7 coming into the on-state, the anode voltage of the organic EL element 61 is initialized on the basis of the initialization voltage Vini.

At time t04, the scanning signal SCAN(n+1) changes from the low level to the high level. Thus, in the pixel circuit 60 in the (n+1)th row, the threshold voltage compensation transistor T2, the write control transistor T3, and the second initialization transistor T7 come into the off-state. At time t04, the light-emission control signals EM(n), EM(n+1) change from the high level to the low level. Thereby, in both the pixel circuit 60 in the nth row and the pixel circuit 60 in the (n+1)th row, the power supply control transistor T5 and the light-emission control transistor T6 come into the on-state, and the drive current corresponding to the charge voltage of the holding capacitor Ca is supplied to the organic EL element 61. As a result, in both the pixel circuit 60 in the nth row and the pixel circuit 60 in the (n+1)th row, the organic EL element 61 emits light in accordance with the magnitude of the drive current. Thereafter, the organic EL element 61 emits light in both the pixel circuit 60 in the nth row and the pixel circuit 60 in the (n+1)th row throughout a period until the next light-emission control signals EM(n), EM(n+1) change from the low level to the high level.

<1.4 Control of Infrared Light (IR Light) Irradiation Timing>

Figure 13:
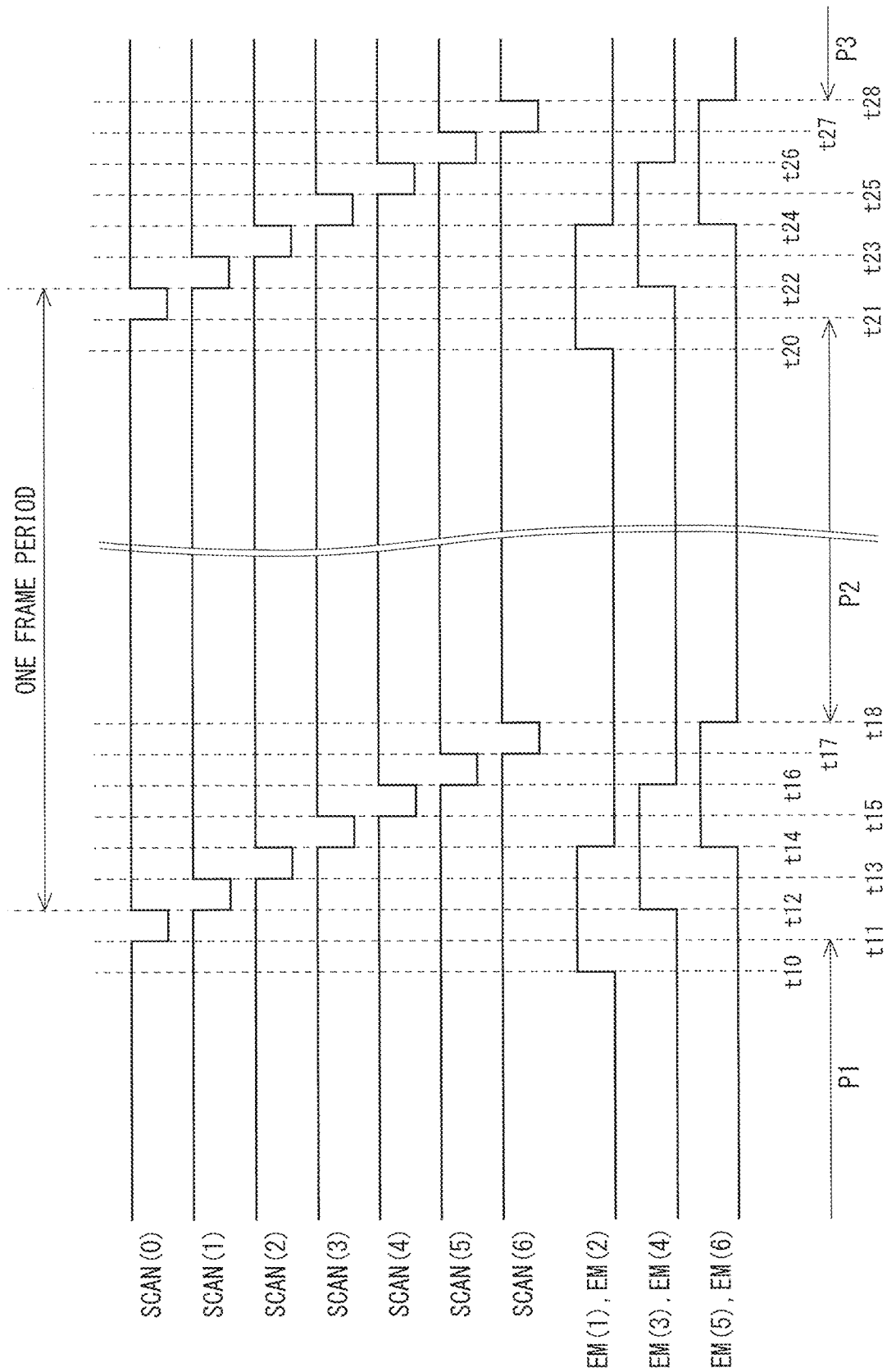
FIG. 13 is a timing chart for explaining an IR light irradiation timing in the first embodiment.

FIG. 13 is a timing chart for explaining an IR light irradiation timing. As can be grasped from FIG. 13, in the present embodiment, light-emission control signals having the same waveform are provided to the two light-emission control lines EM. That is, two adjacent light-emission control lines EM are grouped together as a set, and light-emission control signals having the same waveform are provided to the two light-emission control lines EM of the same set.

Figure 12:
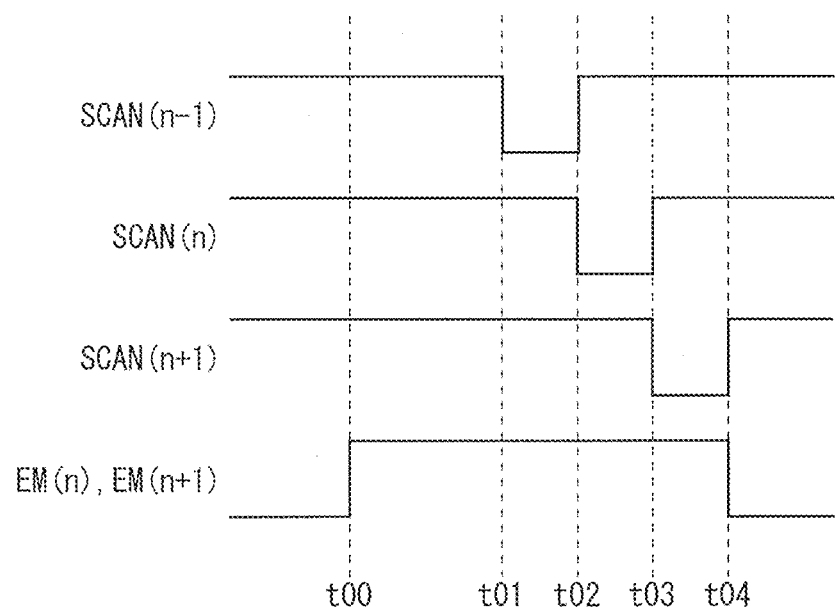
FIG. 12 is a timing chart for explaining the operation of the pixel circuit in the first embodiment.

As described above, in the present embodiment, in the pixel circuit 60 in the nth row, the gate voltage of the drive transistor T4 (the voltage of the control node NG) is initialized during the period during which the scanning signal SCAN(n−1) is at the low level (cf. FIGS. 1 and 12). Further, as described above, in the present embodiment, the region in the first to sixth rows in the display unit 600 is the IR light irradiation region 601. Regarding the IR light irradiation region 601, as can be grasped from the waveforms of the scanning signals SCAN illustrated in FIG. 13, the gate voltage of the drive transistor T4 is initialized during a period from time t11 to time t12 in each of the pixel circuits 60 in the first row, and the gate voltage of the drive transistor T4 is initialized during the period from time t16 to time t17 in each of the pixel circuits 60 in the sixth row. Further, as can be grasped from FIG. 13, the data signals are written into the pixel circuits 60 in the IR light irradiation region 601 sequentially row by row in the period from time t12 to time t18.

Here, in the present embodiment, the IR light irradiation (the emission of the IR light from the emitting unit 72 of the proximity sensor 700) is performed in a period during which the gate voltage of the drive transistor T4 is not being initialized in all the pixel circuits 60 in the IR light irradiation region 601 and writing of the data signal is not performed in all the pixel circuits 60 in the IR light irradiation region 601. That is, in FIG. 13, the IR light irradiation is performed in at least some of periods represented by arrows denoted by reference signs P1, P2, and P3. In this regard, in the periods represented by the arrows denoted by reference signs P1, P2, and P3, even when the on-current of the transistor not provided with the light shielding unit increases due to the IR light irradiation, the increase in the on-current has a small influence on the display. Therefore, by performing the IR light irradiation in such periods, an increase in the difference between luminance characteristics of pixels in the IR light irradiation region 601 and luminance characteristics of pixels outside the IR light irradiation region 601 is suppressed, and deterioration in display quality caused by the IR light irradiation is suppressed.

As above, the emitting unit 72 of the proximity sensor 700 emits the IR light in the period during which the first initialization transistor T1 is in the off-state in each of all the pixel circuits 60 in the IR light irradiation region 601 and the write control transistor T3 is in the off-state in each of all the pixel circuits 60 in the IR light irradiation region 601.

Although the two light-emission control lines EM are grouped together as a set in the present embodiment, the number of light-emission control lines EM equal to the number of rows included in the IR light irradiation region 601 may be grouped together as a set. In the above example where the region in the first to sixth rows in the display unit 600 is the IR light irradiation region 601, six light-emission control lines EM may be grouped together as a set, and the light-emission control signals having the same waveform may be provided to the six light-emission control lines EM in the same set. In addition, although the emission-off period is provided for each row in order to write a data signal, an emission-off period for the purpose of dimming or the like may be provided separately from when the data signal is written.

<1.5 Effects>

According to the present embodiment, in the organic EL display device, the light shielding unit 81 is provided to prevent the channel layer of the first initialization transistor T1 in the pixel circuit 60 from being irradiated with the IR light. Therefore, even when the IR light is emitted from the proximity sensor 700 for sensing, the channel layer of the first initialization transistor T1 is not irradiated with the IR light, and hence the off-current of the first initialization transistor T1 does not increase. Hence the fluctuation of the gate voltage of the drive transistor T4 (the voltage of the control node NG) due to the IR light irradiation is suppressed, so that deterioration in display quality is suppressed. The light shielding unit 81 is provided only for one of the seven transistors in the pixel circuit 60, so that a decrease in the aperture ratio is suppressed, and the accuracy of the sensing is maintained. As above, in the organic EL display device provided with the proximity sensor, deterioration in display quality caused by the IR light irradiation is suppressed as compared with the related art.

Further, according to the present embodiment, the first initialization transistor T1 and the threshold voltage compensation transistor T2 have the dual-gate structure. Hence the off-currents of the first initialization transistor T1 and the threshold voltage compensation transistor T2 is smaller than those in the case of adopting a general structure. Thereby, the fluctuation of the gate voltage of the drive transistor T4 is effectively suppressed, and deterioration in display quality is effectively suppressed. Note that the off-current can be further reduced by adopting the LDD structure for the structure of the first initialization transistor T1.

2. Second Embodiment

A second embodiment of the present disclosure will be described. Hereinafter, only a difference from the first embodiment will be mainly described.

<2.1 Configuration>

Figure 14:
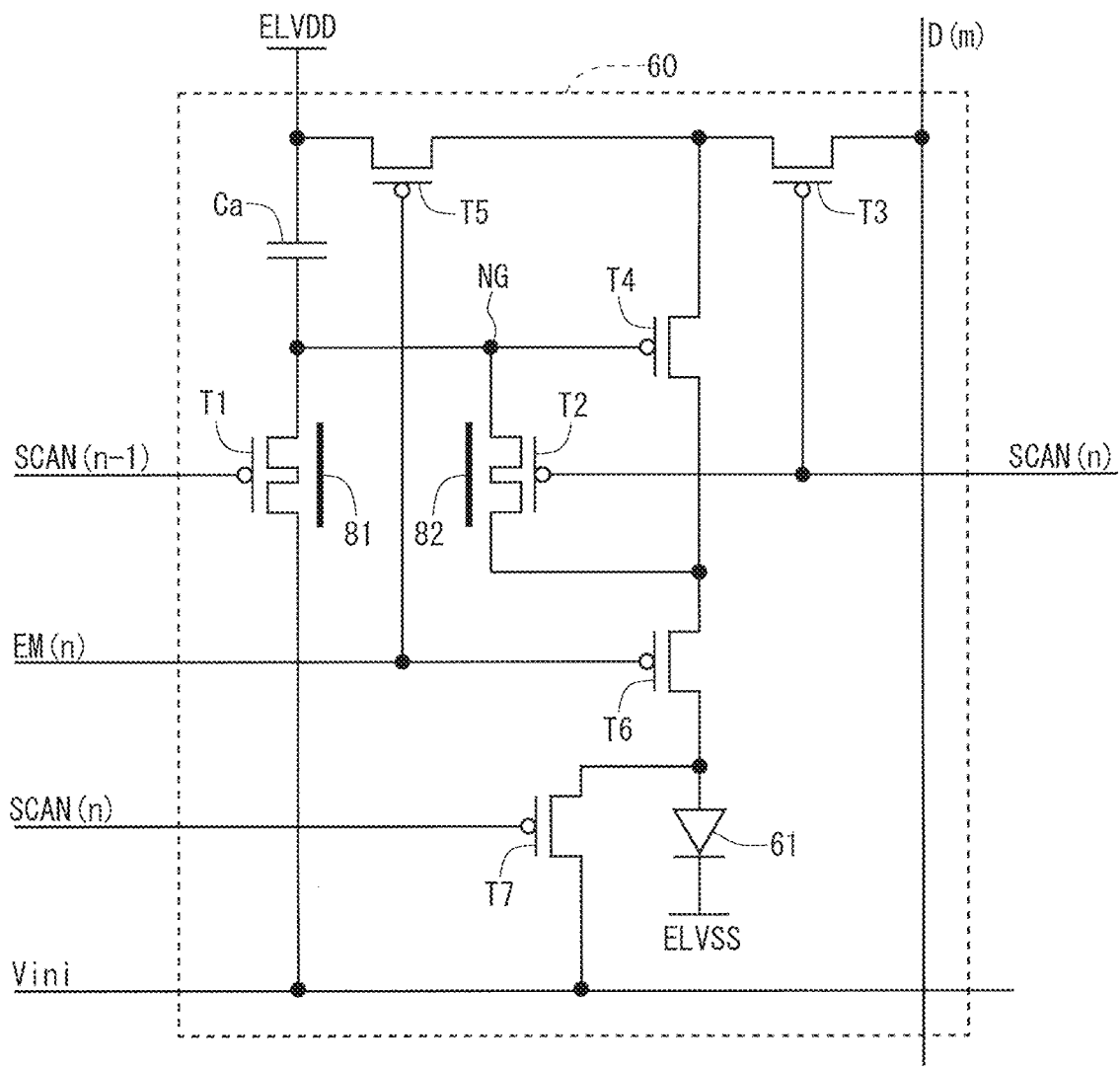
FIG. 14 is a circuit diagram illustrating a configuration of a pixel circuit in the nth row and the mth column in a second embodiment.

In the first embodiment, the light shielding unit 81 is provided corresponding to only the first initialization transistor T1 among the seven transistors in the pixel circuit 60. In contrast, in the present embodiment, as illustrated in FIG. 14, in addition to the light shielding unit 81 corresponding to the first initialization transistor T1, a light shielding unit 82 corresponding to the threshold voltage compensation transistor T2 is provided. The first conduction terminal of the first initialization transistor T1 is electrically connected to the second electrode of the holding capacitor Ca. The second conduction terminal of the threshold voltage compensation transistor T2 is also electrically connected to the second electrode of the holding capacitor Ca. Therefore, in the present embodiment, the light shielding units are provided for the transistors (first initialization transistor T1, threshold voltage compensation transistor T2) in each of which one conduction terminal is connected to the second electrode of the holding capacitor Ca. As above, the organic EL display device according to the present embodiment is provided with the light shielding unit 81 that prevents the channel layer of the first initialization transistor T1 in the pixel circuit 60 from being irradiated with the IR light, and the light shielding unit 82 that prevents the channel layer of the threshold voltage compensation transistor T2 in the pixel circuit 60 from being irradiated with the IR light. In consideration of the manufacturing process, the light shielding unit 81 and the light shielding unit 82 are preferably formed in the same layer and using the same material. Note that a first light shielding unit is achieved by the light shielding unit 81, and a second light shielding unit is achieved by the light shielding unit 82.

Figure 15:
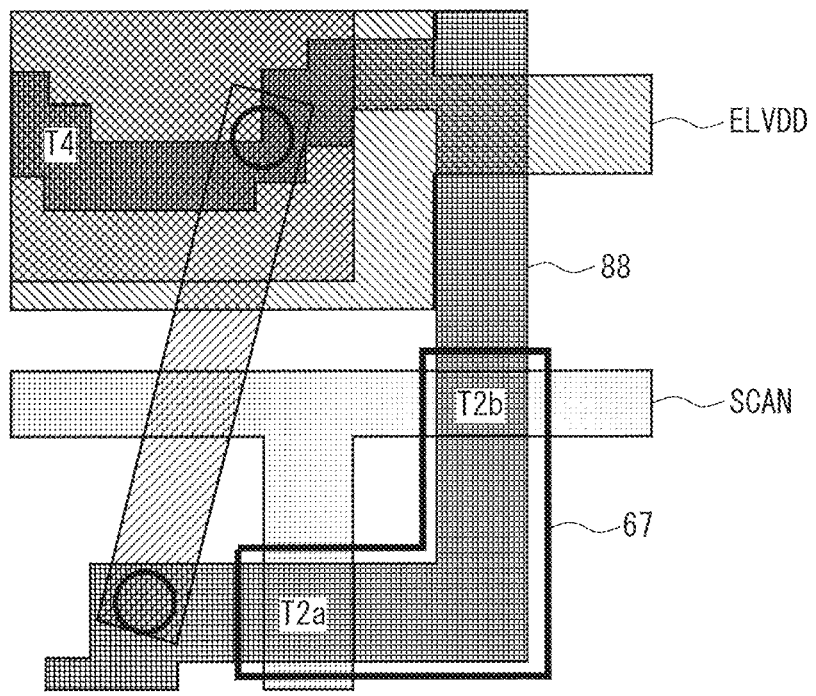
FIG. 15 is a diagram for explaining a placement position (first example) of a light shielding unit for a threshold voltage compensation transistor in the second embodiment.
Figure 16:
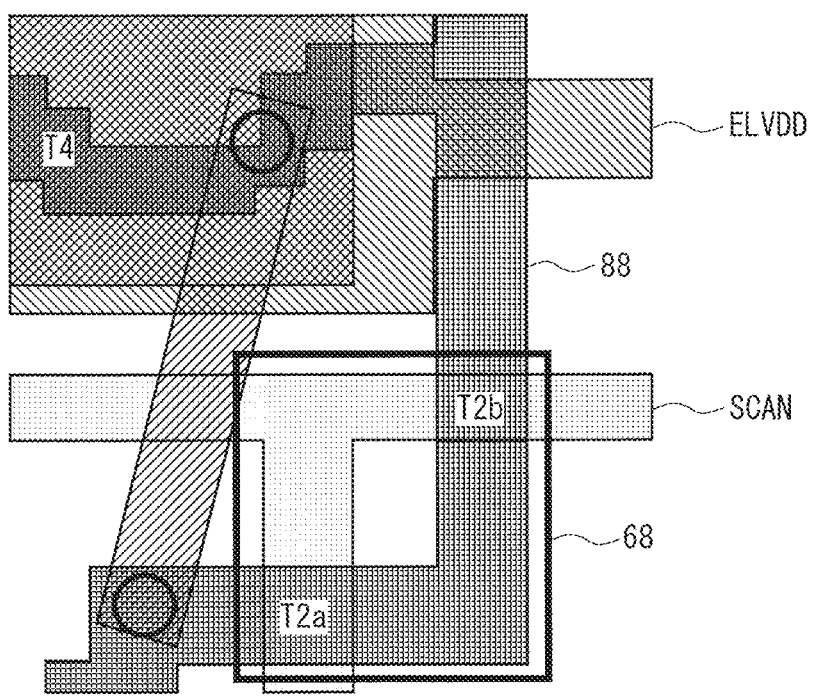
FIG. 16 is a diagram for explaining a placement position (second example) of a light shielding unit for the threshold voltage compensation transistor in the second embodiment.
Figure 17:
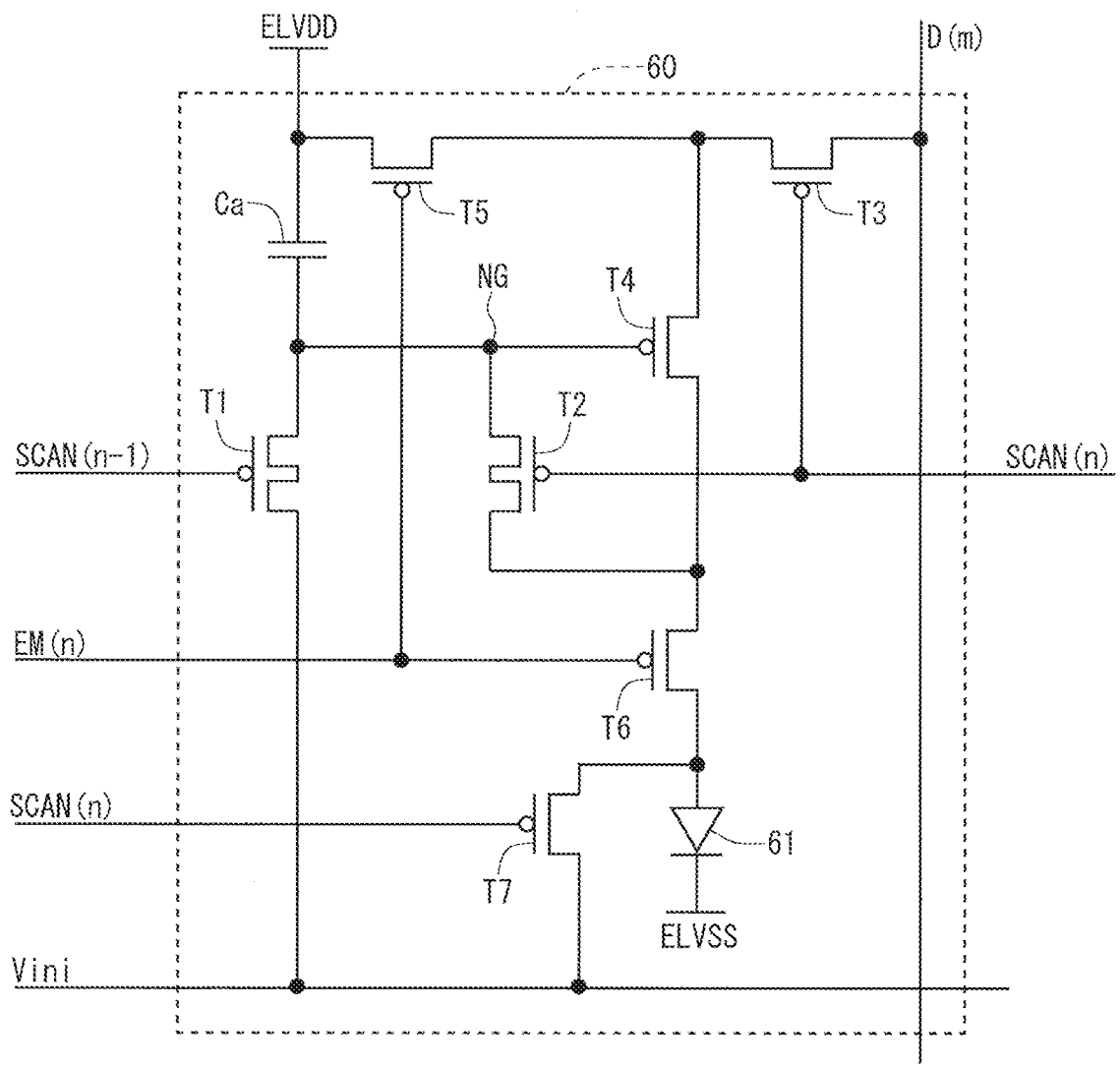
FIG. 17 is a circuit diagram illustrating a configuration example of a known pixel circuit in the nth row and the mth column.
Figure 18:
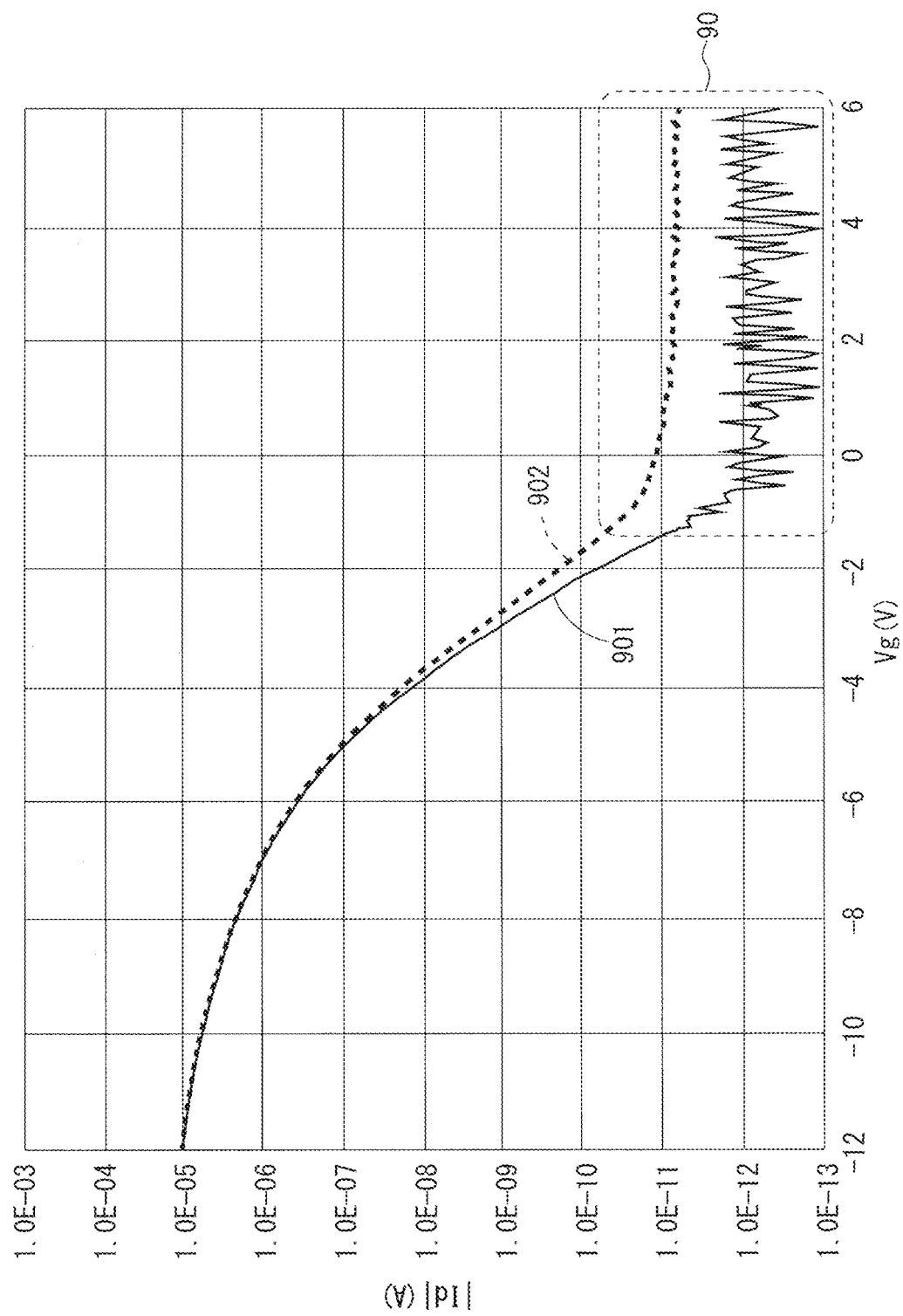
FIG. 18 is a diagram for explaining an example of a change in a current-voltage characteristic when a thin-film transistor is irradiated with IR light.
Figure 19:
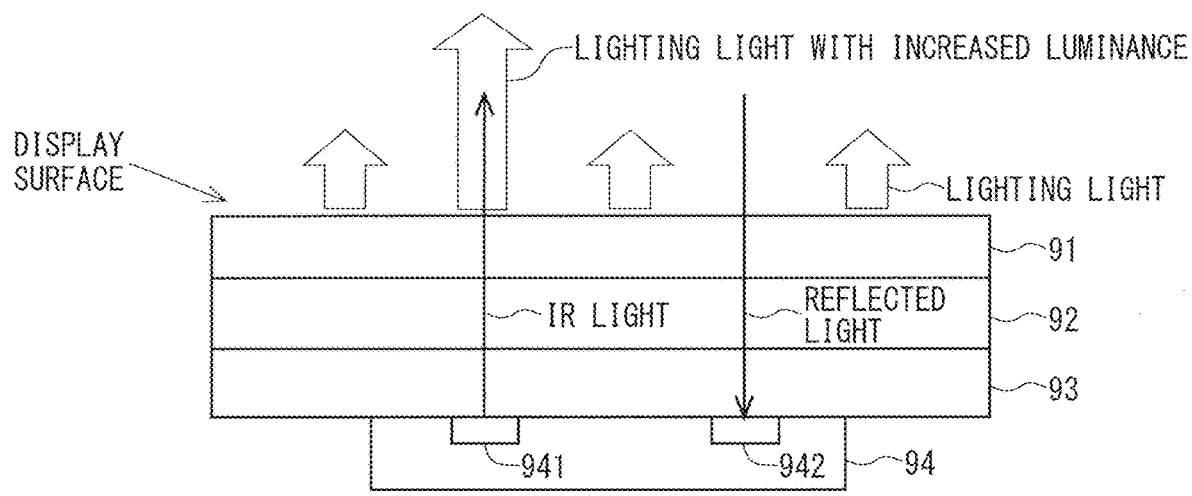
FIG. 19 is a schematic diagram for explaining an increase in luminance of a pixel.
Figure 20:
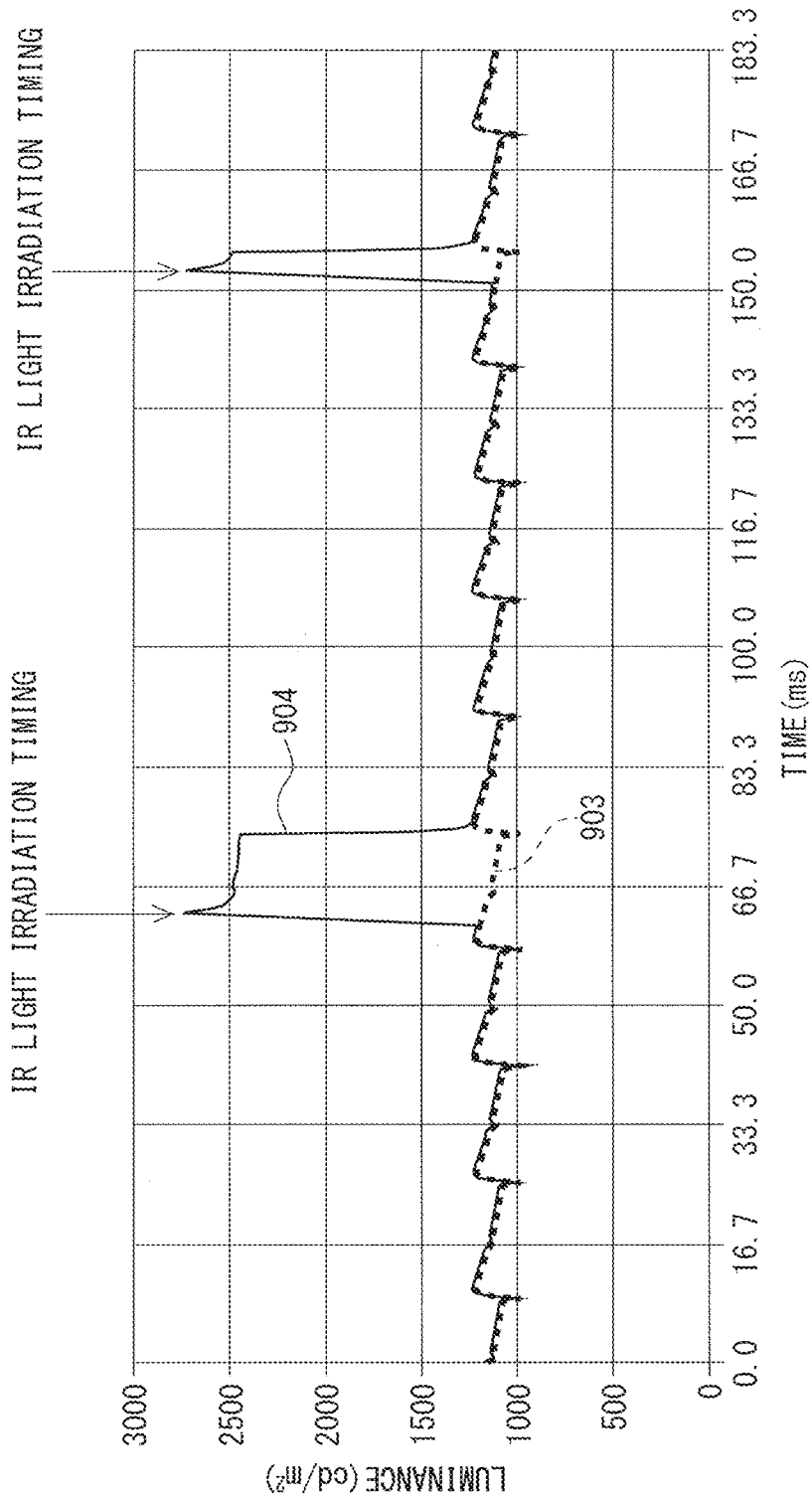
FIG. 20 is a diagram for explaining the influence of the IR light irradiation on display luminance.

FIGS. 15 and 16 are enlarged views of the vicinity of one threshold voltage compensation transistor T2 in the layout diagram illustrated in FIG. 6. FIG. 15 illustrates a first example of the placement position of the light shielding unit 82, and FIG. 16 illustrates a second example of the placement position of the light shielding unit 82. In the first example, the light shielding unit 82 is provided in a region within a thick frame denoted by reference numeral 67 in FIG. 15. That is, the light shielding unit 82 has an L shape in accordance with the shape of the wiring (wiring made of a semiconductor layer) 88 in the portion where the threshold voltage compensation transistor T2 exists. In the second example, the light shielding unit 82 is provided in a region within a thick frame denoted by reference numeral 68 in FIG. 16. That is, the light shielding unit 82 has a rectangular shape.

Similarly to the structure of the first initialization transistor T1, the structure of the threshold voltage compensation transistor T2 may adopt the general LDD structure or the one-side LDD structure. When the general LDD structure is adopted as the structure of the threshold voltage compensation transistor T2, the light shielding unit 82 may be provided such that the entire channel region (channel layer) is shielded from light. When the one-side LDD structure is adopted for the structure of the threshold voltage compensation transistor T2, the light shielding unit 82 may be provided such that the entire channel region is shielded from light, or the light shielding unit 82 may be provided such that the source-side region of the entire channel region (channel layer) is shielded from light.

<2.2 Effects>

According to the present embodiment, the channel layers of the first initialization transistor T1 and the threshold voltage compensation transistor T2 in the pixel circuit 60 are prevented from being irradiated with the IR light. Therefore, even when the IR light is emitted from the proximity sensor 700 for sensing, the off-currents of the first initialization transistor T1 and the threshold voltage compensation transistor T2 do not increase. Therefore, as compared with the first embodiment, the fluctuation of the gate voltage of the drive transistor 14 (the voltage of the control node NG) due to the IR light irradiation is suppressed effectively. That is, deterioration in display quality due to the IR light irradiation is suppressed effectively.

<3. Others>

Although the organic EL display device has been described as an example in each of the above embodiments, it is not limited to this. The present disclosure can also be applied to an inorganic EL display device, a quantum dot light-emitting diode (QLED) display device, and the like so long as the display device includes a proximity sensor and adopts a display element driven by a current.

DESCRIPTION OF REFERENCE CHARACTERS

6: ORGANIC EL PANEL
60: PIXEL CIRCUIT
61: ORGANIC EL ELEMENT
72: emitting unit (OF PROXIMITY SENSOR)
74: LIGHT RECEIVING UNIT (OF PROXIMITY SENSOR)
81, 82: LIGHT SHIELDING UNIT
300: SOURCE DRIVER (DATA SIGNAL LINE DRIVE CIRCUIT)
400: GATE DRIVER (SCANNING SIGNAL LINE DRIVE CIRCUIT)
500: EMISSION DRIVER (LIGHT-EMISSION CONTROL LINE DRIVE CIRCUIT)
600: DISPLAY UNIT
601: IR LIGHT IRRADIATION REGION
700: PROXIMITY SENSOR
D (1) to D (i): DATA SIGNAL LINE, DATA SIGNAL
EM (1) to EM (j): LIGHT-EMISSION CONTROL LINE, LIGHT-EMISSION CONTROL SIGNAL
SCAN (1) to SCAN (j): SCANNING SIGNAL LINE, SCANNING SIGNAL
NG: CONTROL NODE
T1: FIRST INITIALIZATION TRANSISTOR
T2: THRESHOLD VOLTAGE COMPENSATION TRANSISTOR
T3: WRITE CONTROL TRANSISTOR
T4: DRIVE TRANSISTOR
T5: POWER SUPPLY CONTROL TRANSISTOR
T6: LIGHT-EMISSION CONTROL TRANSISTOR
T7: SECOND INITIALIZATION TRANSISTOR

The invention claimed is:

1. A display device provided with a pixel circuit including a display element driven by a current, the display device comprising:
    a display unit that includes
    a plurality of the pixel circuits of a plurality of rows and a plurality of columns,
    a plurality of data signal lines configured to supply data signals to a plurality of the pixel circuits in corresponding respective columns,
    a plurality of scanning signal lines configured to control writing of the data signals into a plurality of the pixel circuits in corresponding respective rows,
    a plurality of light-emission control lines configured to control whether to supply a current to the display element included in each of a plurality of the pixel circuits in the corresponding respective rows, a first power line configured to supply a high-level power supply voltage, a second power line configured to supply a low-level power supply voltage, and an initialization power line configured to supply an initialization voltage; and a proximity sensor that includes an emitting unit configured to emit infrared light from a back surface of the display unit, and a light receiving unit configured to receive reflected light of the infrared light, wherein each pixel circuit includes a control node, the display element including a first terminal and a second terminal connected to the second power line, a drive transistor having a control terminal connected to the control node, a first conduction terminal, and a second conduction terminal, the drive transistor being provided in series with the display element, a light-emission control transistor having a control terminal connected to one of the plurality of light-emission control lines, a first conduction terminal, and a second conduction terminal, the light-emission control transistor being provided in series with the display element, a holding capacitor having one end connected to the first power line and the other end connected to the control node, a write control transistor having a control terminal connected to one of the plurality of scanning signal lines, a first conduction terminal connected to one of the plurality of data signal lines, and a second conduction terminal connected to the first conduction terminal of the drive transistor, a threshold voltage compensation transistor having a control terminal connected to one of the plurality of scanning signal lines, a first conduction terminal connected to the second conduction terminal of the drive transistor, and a second conduction terminal connected to the control node, and a first initialization transistor having a control terminal connected to one of the plurality of scanning signal lines, a first conduction terminal connected to the control node, and a second conduction terminal connected to the initialization power line, and a first light shielding unit configured to prevent a channel layer of the first initialization transistor from being irradiated with the infrared light is provided.

2. The display device according to claim 1, wherein a light shielding unit configured to prevent a channel layer of a transistor included in the pixel circuit from being irradiated with the infrared light is the first light shielding unit provided in an island shape corresponding to the pixel circuit.

3. The display device according to claim 1, wherein a second light shielding unit that prevents a channel layer of the threshold voltage compensation transistor from being irradiated with the infrared light is provided.

4. The display device according to claim 3, wherein the first light shielding unit and the second light shielding unit are formed in the same layer and using the same material.

5. The display device according to claim 1, wherein the first light shielding unit is provided for each pixel circuit in a whole of the display unit.

6. The display device according to claim 1, wherein the first initialization transistor has a lightly doped drain (LDD) structure.

7. The display device according to claim 6, wherein
the first initialization transistor has the LDD structure only for one of a first conduction terminal side and a second conduction terminal side, and
the first light shielding unit is provided on a side having no LDD structure out of the first conduction terminal side and the second conduction terminal side.

8. The display device according to claim 1, wherein the first initialization transistor has a dual-gate structure including two transistors connected in series.

9. The display device according to claim 1, wherein the first light shielding unit is a metal member and is electrically connected to the first conduction terminal or the second conduction terminal of the first initialization transistor.

10. The display device according to claim 1, wherein the first light shielding unit is a plate-shaped metal member made of the same material as the plurality of scanning signal lines.

11. The display device according to claim 1, wherein the first light shielding unit is a plate-shaped resin member having a property of absorbing the infrared light.

12. The display device according to claim 1, wherein the first light shielding unit is a plate-shaped resin member having a property of scattering the infrared light.

13. The display device according to claim 1, wherein
the first conduction terminal of the light-emission control transistor is connected to the second conduction terminal of the drive transistor, and
the second conduction terminal of the light-emission control transistor is connected to the first terminal of the display element, and
each pixel circuit includes a power supply control transistor having a control terminal connected to one of the plurality of light-emission control lines, a first conduction terminal connected to the first power line, and a second conduction terminal connected to the first conduction terminal of the drive transistor.

14. The display device according to claim 13, wherein each pixel circuit includes a second initialization transistor having a control terminal connected to one of the plurality of scanning signal lines, a first conduction terminal connected to the first terminal of the display element, and a second conduction terminal connected to the initialization power line.

15. The display device according to claim 1, wherein the emitting unit emits the infrared light in a period during which the first initialization transistor is in an off-state in each of all pixel circuits in an infrared light irradiation region that is irradiated with the infrared light and the write control transistor is in an off-state in each of all pixel circuits in the infrared light irradiation region.

* * * * *